(12) United States Patent
Elkins et al.

(10) Patent No.: US 8,438,357 B1
(45) Date of Patent: May 7, 2013

(54) METHOD AND APPARATUS FOR CALCULATING NUMBER OF MEMORY ACCESS CYCLES WHEN TRANSFERRING DATA TO OR FROM A MEMORY

(75) Inventors: Adam Elkins, Rio Rancho, NM (US); Wayne E. Wennekamp, Rio Rancho, NM (US); Roger D. Flateau, Jr., Albuquerque, NM (US)

(73) Assignee: Xilinx, Inc., San Jose, CA (US)

( * ) Notice: Subject to any disclaimer, the term of this patent is extended or adjusted under 35 U.S.C. 154(b) by 552 days.

(21) Appl. No.: 12/690,856

(22) Filed: Jan. 20, 2010

Related U.S. Application Data

(60) Provisional application No. 61/148,926, filed on Jan. 31, 2009, provisional application No. 61/148,927, filed on Jan. 31, 2009.

(51) Int. Cl.
*G06F 13/00* (2006.01)

(52) U.S. Cl.
USPC .......................... 711/167; 711/111; 711/154

(58) Field of Classification Search .................. 711/111, 711/154, 167
See application file for complete search history.

(56) References Cited

U.S. PATENT DOCUMENTS

| | | | |
|---|---|---|---|
| 5,864,568 A | 1/1999 | Nemazie | |
| 6,591,294 B2 | 7/2003 | Kawasaki et al. | |
| 7,043,595 B2 | 5/2006 | Kawai | |
| 8,307,182 B1 * | 11/2012 | Flateau et al. | 711/167 |
| 2004/0199716 A1 | 10/2004 | Kawasaki et al. | |

OTHER PUBLICATIONS

U.S. Appl. No. 12/689,558, filed Jan. 19, 2010, Shimanek et al., Xilinx, Inc., 2100 Logic Drive, San Jose, CA.
U.S. Appl. No. 12/689,585, filed Jan. 19, 2010, Shimanek, et al., Xilinx, Inc., 2100 Logic Drive, San Jose, CA.
U.S. Appl. No. 12/689,604, filed Jan. 19, 2010, Flateau, Jr., et al., Xilinx, Inc., 2100 Logic Drive, San Jose, CA.
U.S. Appl. No. 12/694,615, filed Jan. 27, 2010, Shimanek, et al., Xilinx, Inc., 2100 Logic Drive, San Jose, CA.
U.S. Appl. No. 12/694,665, filed Jan. 27, 2010, Wennekamp, et al., Xilinx, Inc., 2100 Logic Drive, San Jose, CA.
U.S. Appl. No. 12/694,973, filed Jan. 27, 2010, Shimanek, et al., Xilinx, Inc., 2100 Logic Drive, San Jose, CA.
U.S. Appl. No. 12/689,636, filed Jan. 19, 2010, Wennekamp, et al., Xilinx, Inc., 2100 Logic Drive, San Jose, CA.
U.S. Appl. No. 12/693,397, filed Jan. 25, 2010, Wennekamp, et al., Xilinx, Inc., 2100 Logic Drive, San Jose, CA.
U.S. Appl. No. 12/692,771, filed Jan. 25, 2010, Flateau, Jr., et al., Xilinx, Inc., 2100 Logic Drive, San Jose, CA.
U.S. Appl. No. 12/696,672, filed Jan. 29, 2010, Shimanek, et al., Xilinx, Inc., 2100 Logic Drive, San Jose, CA.
U.S. Appl. No. 12/695,341, filed Jan. 28, 2010, Strader, et al., Xilinx, Inc., 2100 Logic Drive, San Jose, CA.
U.S. Appl. No. 12/695,099, filed Jan. 27, 2010, Shimanek, et al., Xilinx, Inc., 2100 Logic Drive, San Jose, CA.
U.S. Appl. No. 12/694,656, filed Jan. 27, 2010, Elkins, et al., Xilinx, Inc., 2100 Logic Drive, San Jose, CA.

* cited by examiner

*Primary Examiner* — Reba I Elmore
(74) *Attorney, Agent, or Firm* — Murray Smith; Kevin T. Cuenot

(57) ABSTRACT

A technique applicable during the transfer of data to and from a memory involves: operating a memory interface using memory access cycles that each transfer a quantity of data D across the memory interface; receiving a request to transfer a quantity of data Q across the memory interface; and calculating a value M as a function of a plurality of parameters, M being a minimum number of the memory access cycles needed to carry out the transfer of the quantity of data Q across the memory interface, wherein the calculating includes determining a logarithm of one of the parameters, and then determining the value M as a function of the logarithm.

20 Claims, 17 Drawing Sheets

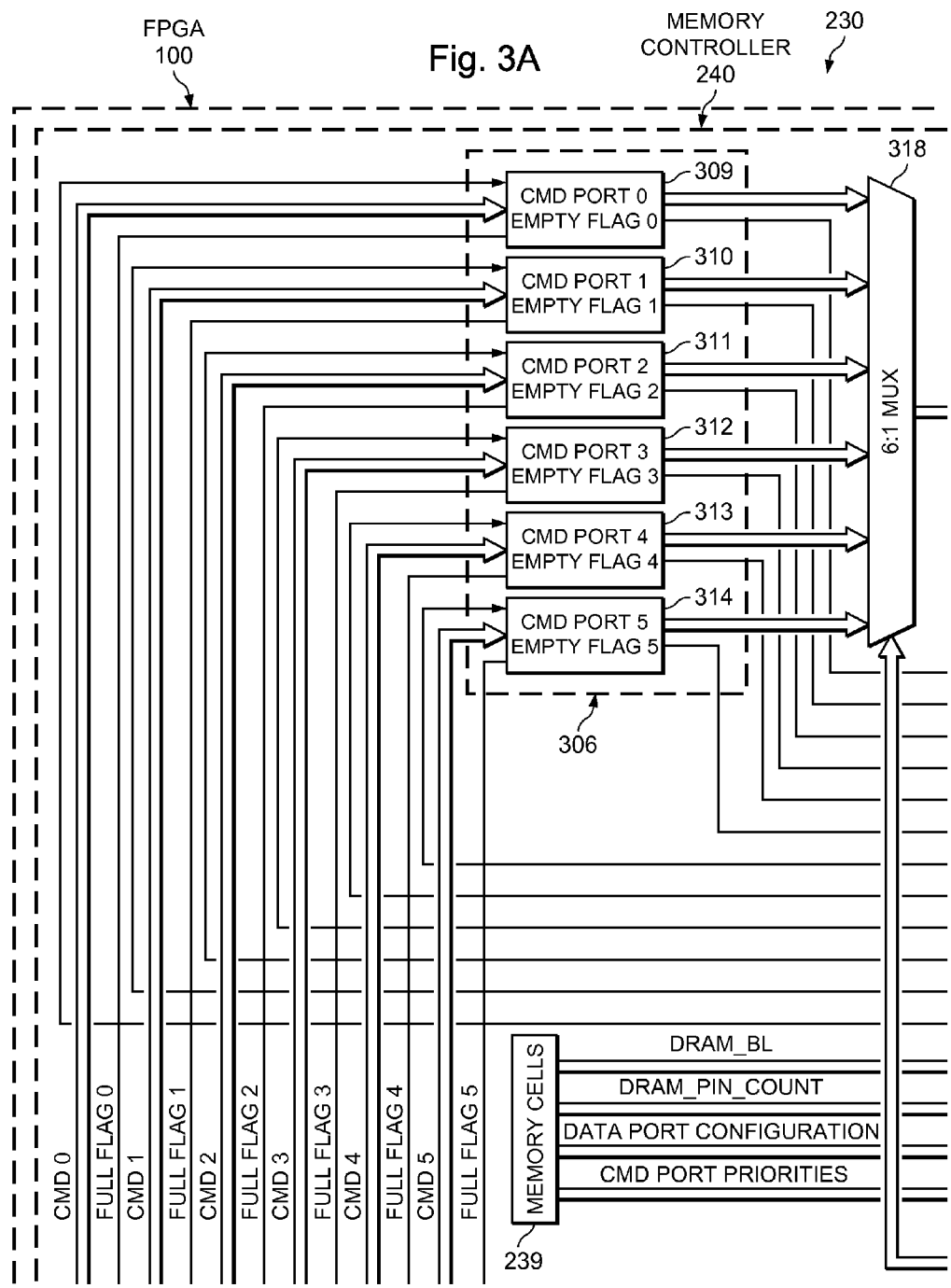

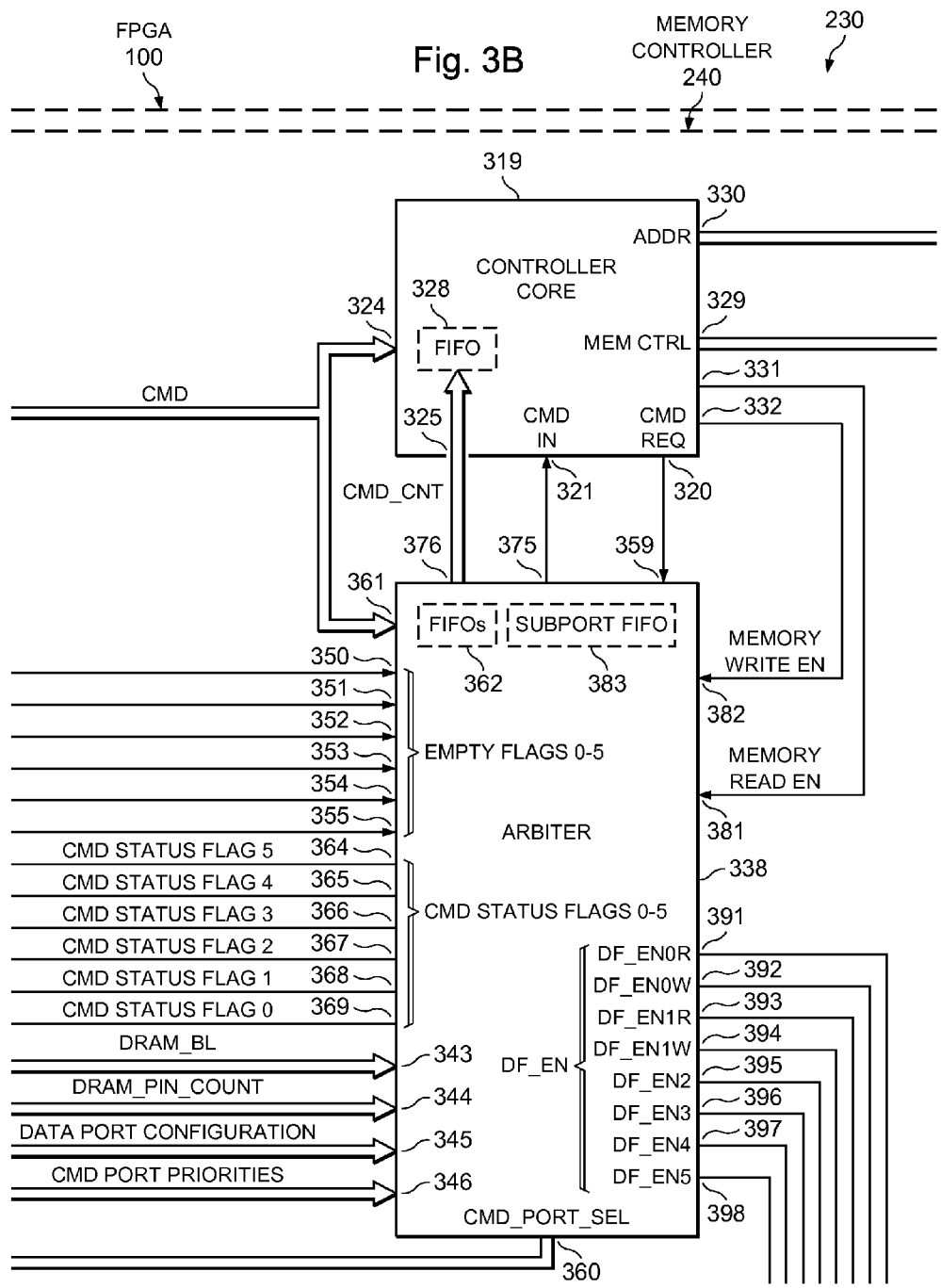

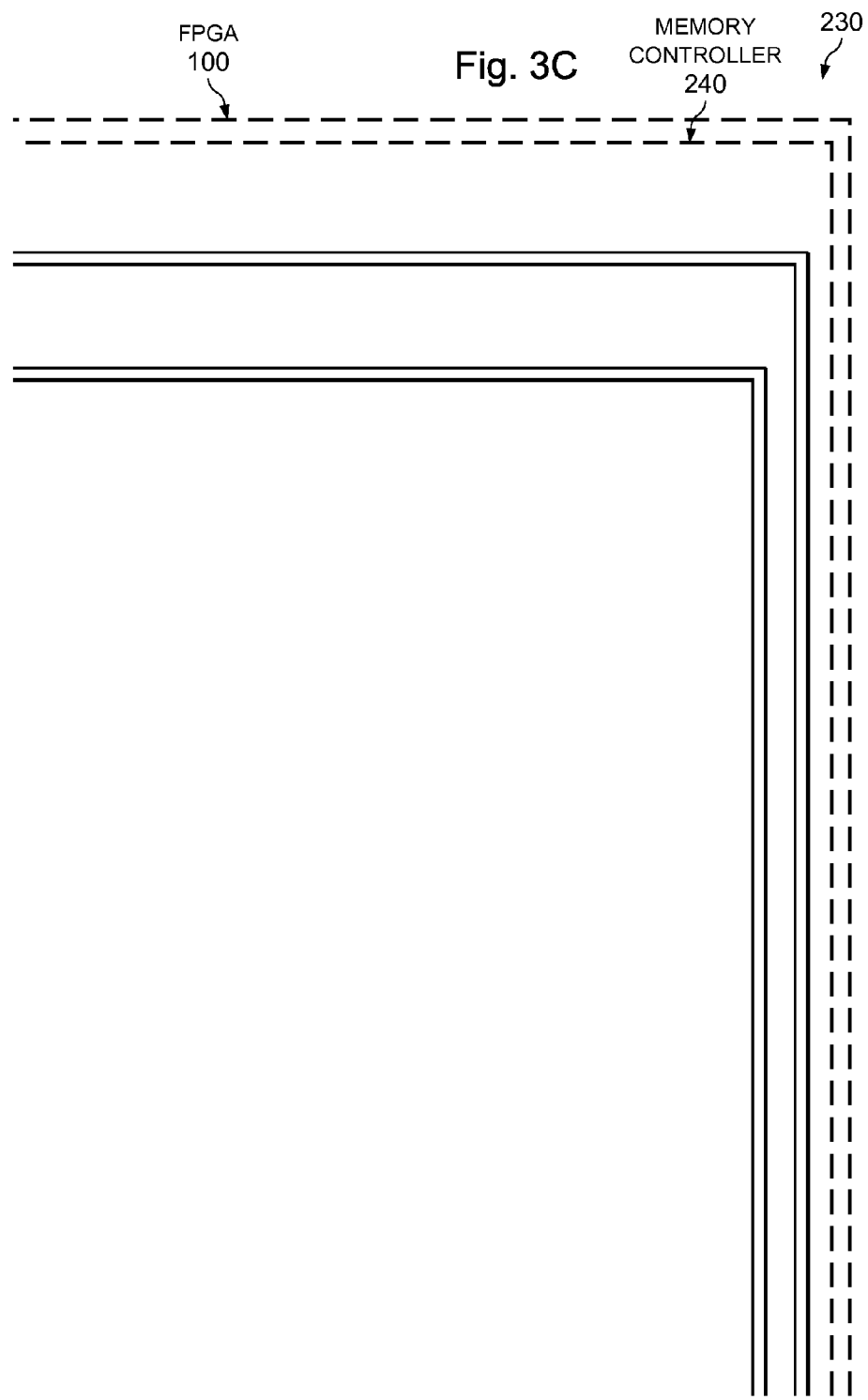

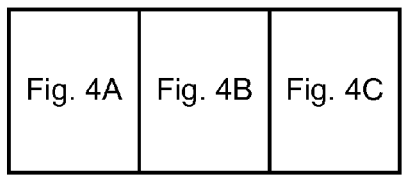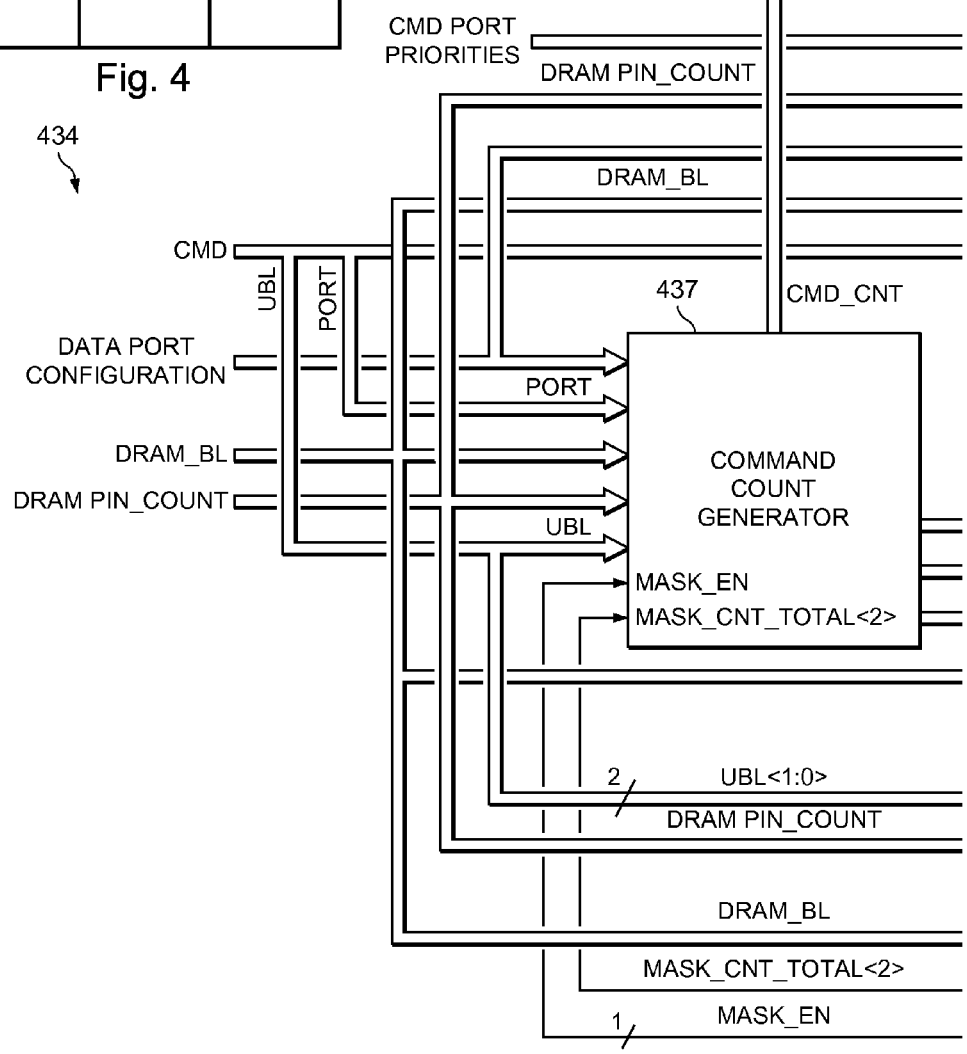

of memory access cycles needed to transfer a specified amount of data must be determined and may vary, depending on factors such as the amount of data and the difference (if any) between the starting address and the nearest prior memory address boundary. Although pre-existing techniques for determining this minimum number of memory access cycles have been generally adequate for their intended purposes, they have not been entirely satisfactory in all respects.

METHOD AND APPARATUS FOR CALCULATING NUMBER OF MEMORY ACCESS CYCLES WHEN TRANSFERRING DATA TO OR FROM A MEMORY

CROSS-REFERENCE TO RELATED APPLICATIONS

This application claims benefit of U.S. Provisional Patent Application having the Application No. 61/148,926 filed on Jan. 31, 2009 and entitled "Apparatus and Method for a Memory Controller"; and also U.S. Provisional Patent Application having the Application No. 61/148,927 filed on Jan. 31, 2009 and entitled "Architecture for Advanced Integrated Circuit Providing Good Performance and Low Cost." Both of these provisional patent applications are incorporated herein by reference in their entirety.

FIELD OF THE INVENTION

An embodiment of the invention relates to techniques for transferring data to and from a memory. More particularly, an embodiment of the invention relates to techniques for determining the minimum number of memory access cycles needed to transfer a given quantity of data to or from a memory.

BACKGROUND OF THE INVENTION

Programmable logic devices (PLDs) are a well-known type of integrated circuit that can be programmed to perform specified logic functions. One type of PLD, the field programmable gate array (FPGA), typically includes an array of programmable tiles. These programmable tiles can include, for example, input/output blocks (IOBs), configurable logic blocks (CLBs), dedicated random access memory blocks (BRAM), multipliers, digital signal processing blocks (DSPs), processors, clock managers, delay lock loops (DLLs), and so forth.

Each programmable tile typically includes both programmable interconnect and programmable logic. The programmable interconnect typically includes a large number of interconnect lines of varying lengths interconnected by programmable interconnect points (PIPs). The programmable logic implements the logic of a user design using programmable elements that can include, for example, function generators, registers, arithmetic logic, and so forth.

The programmable interconnect and programmable logic are typically programmed by loading a stream of configuration data into internal configuration memory cells that define how the programmable elements are configured. The configuration data can be read from memory (e.g., from an external PROM) or written into the FPGA by an external device. The collective states of the individual memory cells then determine the function of the FPGA.

Another type of PLD is the Complex Programmable Logic Device, or CPLD. A CPLD includes two or more "function blocks" connected together and to input/output (I/O) resources by an interconnect switch matrix. Each function block of the CPLD includes a two-level AND/OR structure similar to those used in Programmable Logic Arrays (PLAs) and Programmable Array Logic (PAL) devices. In CPLDs, configuration data is typically stored on-chip in non-volatile memory. In some CPLDs, configuration data is stored on-chip in non-volatile memory, then downloaded to volatile memory as part of an initial configuration (programming) sequence.

For all of these programmable logic devices (PLDs), the functionality of the device is controlled by data bits provided to the device for that purpose. The data bits can be stored in volatile memory (e.g., static memory cells, as in FPGAs and some CPLDs), in non-volatile memory (e.g., FLASH memory, as in some CPLDs), or in any other type of memory cell.

Other PLDs are programmed by applying a processing layer, such as a metal layer, that programmably interconnects the various elements on the device. These PLDs are known as mask programmable devices. PLDs can also be implemented in other ways, e.g., using fuse or antifuse technology. The terms "PLD" and "programmable logic device" include but are not limited to these exemplary devices, as well as encompassing devices that are only partially programmable. For example, one type of PLD includes a combination of hard-coded transistor logic and a programmable switch fabric that programmably interconnects the hard-coded transistor logic.

PLDs are sometimes field programmed to define a memory controller that can interface the PLD to an external memory device. External memory devices typically effect reads and writes by carrying out one or more memory access cycles that each begin on certain predefined memory address boundaries, and that each involve accessing a predetermined number of memory locations representing a specific quantity of data. The memory controller may be asked to read from or write to the external memory device a specified amount of data, beginning at a starting address that may or may not be one of the predefined address boundaries. The minimum number of memory access cycles needed to transfer the specified amount of data must be determined and may vary, depending on factors such as the amount of data and the difference (if any) between the starting address and the nearest prior memory address boundary. Although pre-existing techniques for determining this minimum number of memory access cycles have been generally adequate for their intended purposes, they have not been entirely satisfactory in all respects.

SUMMARY OF THE INVENTION

One embodiment of the invention involves a method of operating a circuit that includes a memory interface. The method includes: operating the memory interface using memory access cycles that each transfer a quantity of data D across the memory interface; receiving a request to transfer a quantity of data Q across the memory interface; and calculating a value M as a function of a plurality of parameters, M being a minimum number of the memory access cycles needed to carry out the transfer of the quantity of data Q across the memory interface, wherein the calculating includes determining a logarithm of one of the parameters, and then determining the value M as a function of the logarithm.

Another embodiment of the invention involves a circuit that includes a memory interface that operates using memory access cycles that each transfer a quantity of data D across the memory interface. In response to receipt of a request to transfer a quantity of data Q across the memory interface, the circuit performs a calculation to determine a value M as a function of a plurality of parameters, M being a minimum number of the memory access cycles needed to carry out the transfer of the quantity of data Q across the memory interface, wherein the calculation includes determining a logarithm of one of the parameters, and then determining the value M as a function of the logarithm.

DETAILED DESCRIPTION

Figure 1:
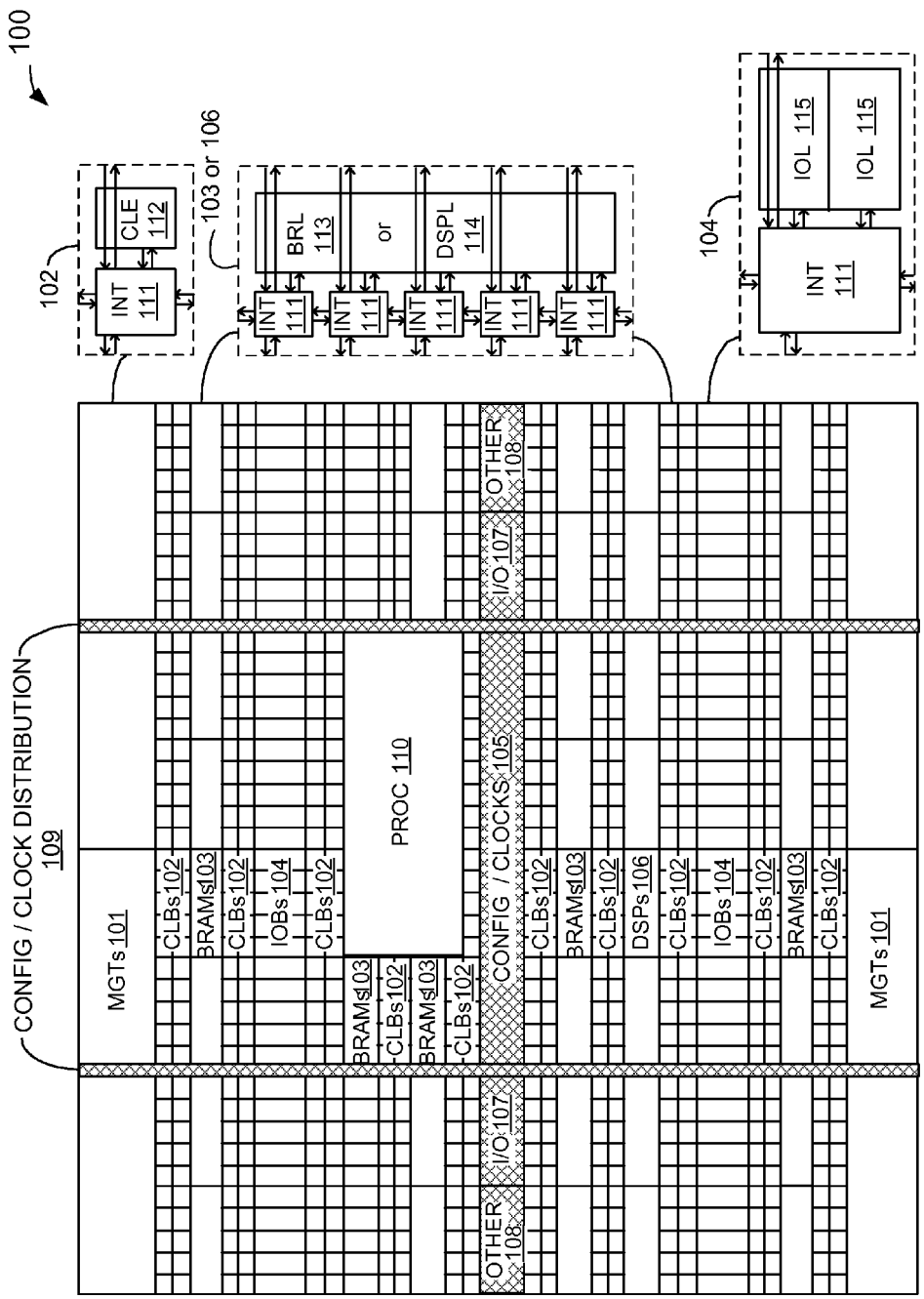
FIG. 1 is a diagrammatic view of an advanced field programmable gate array (FPGA) architecture that includes several different types of programmable logic blocks.

FIG. 1 is a diagrammatic view of an advanced field programmable gate array (FPGA) architecture 100 that includes several different types of programmable logic blocks. For example, the FPGA architecture 100 in FIG. 1 has a large number of different programmable tiles, including multi-gigabit transceivers (MGTs) 101, configurable logic blocks (CLBs) 102, random access memory blocks (BRAMs) 103, input/output blocks (IOBs) 104, configuration and clocking logic (CONFIG/CLOCKS) 105, digital signal processing blocks (DSPs) 106, specialized input/output blocks (I/O) 107 (e.g. configuration ports and clock ports), and other programmable logic 108 such as digital clock managers, analog-to-digital converters, system monitoring logic, and so forth. The FPGA 100 also includes dedicated processor blocks (PROC) 110.

In the FPGA 100, each programmable tile includes a programmable interconnect element (INT) 111 having standardized connections to and from a corresponding interconnect element in each adjacent tile. Therefore, the programmable interconnect elements taken together implement the programmable interconnect structure for the illustrated FPGA. The programmable interconnect element (INT) 111 also includes the connections to and from the programmable logic element within the same tile, as shown by the examples included at the top of FIG. 1.

For example, a CLB 102 can include a configurable logic element (CLE) 112 that can be programmed to implement user logic plus a single programmable interconnect element (INT) 111. A BRAM 103 can include a BRAM logic element (BRL) 113 in addition to one or more programmable interconnect elements. Typically, the number of interconnect elements included in a tile depends on the height of the tile. In the pictured embodiment, a BRAM tile has the same height as five CLBs, but other numbers (e.g., four) can also be used. A DSP tile 106 can include a DSP logic element (DSPL) 114 in addition to an appropriate number of programmable interconnect elements. An IOB 104 can include, for example, two instances of an input/output logic element (IOL) 115 in addition to one instance of the programmable interconnect element (INT) 111. As will be clear to those of skill in the art, the actual I/O pads connected, for example, to the I/O logic element 115 typically are not confined to the area of the input/output logic element 115.

In the pictured embodiment, a columnar area near the center of the die (shown shaded in FIG. 1) is used for configuration, clock, and other control logic. Horizontal areas 109 extending from this column are used to distribute the clocks and configuration signals across the breadth of the FPGA. In other embodiments, the configuration logic may be located in different areas of the FPGA die, such as in the corners of the die.

Some FPGAs utilizing the architecture illustrated in FIG. 1 include additional logic blocks that disrupt the regular columnar structure making up a large part of the FPGA. The additional logic blocks can be programmable blocks and/or dedicated logic. For example, the processor block PROC 110 shown in FIG. 1 spans several columns of CLBs and BRAMs.

FIG. 1 illustrates one exemplary FPGA architecture. For example, the numbers of logic blocks in a column, the relative width of the columns, the number and order of columns, the types of logic blocks included in the columns, the relative sizes of the logic blocks, the locations of the logic blocks within the array, and the interconnect/logic implementations included at the top of FIG. 1 are purely exemplary. In an actual FPGA, more than one adjacent column of CLBs is typically included wherever the CLBs appear, to facilitate the efficient implementation of user logic, but the number of adjacent CLB columns varies with the overall size of the FPGA.

Figure 2:
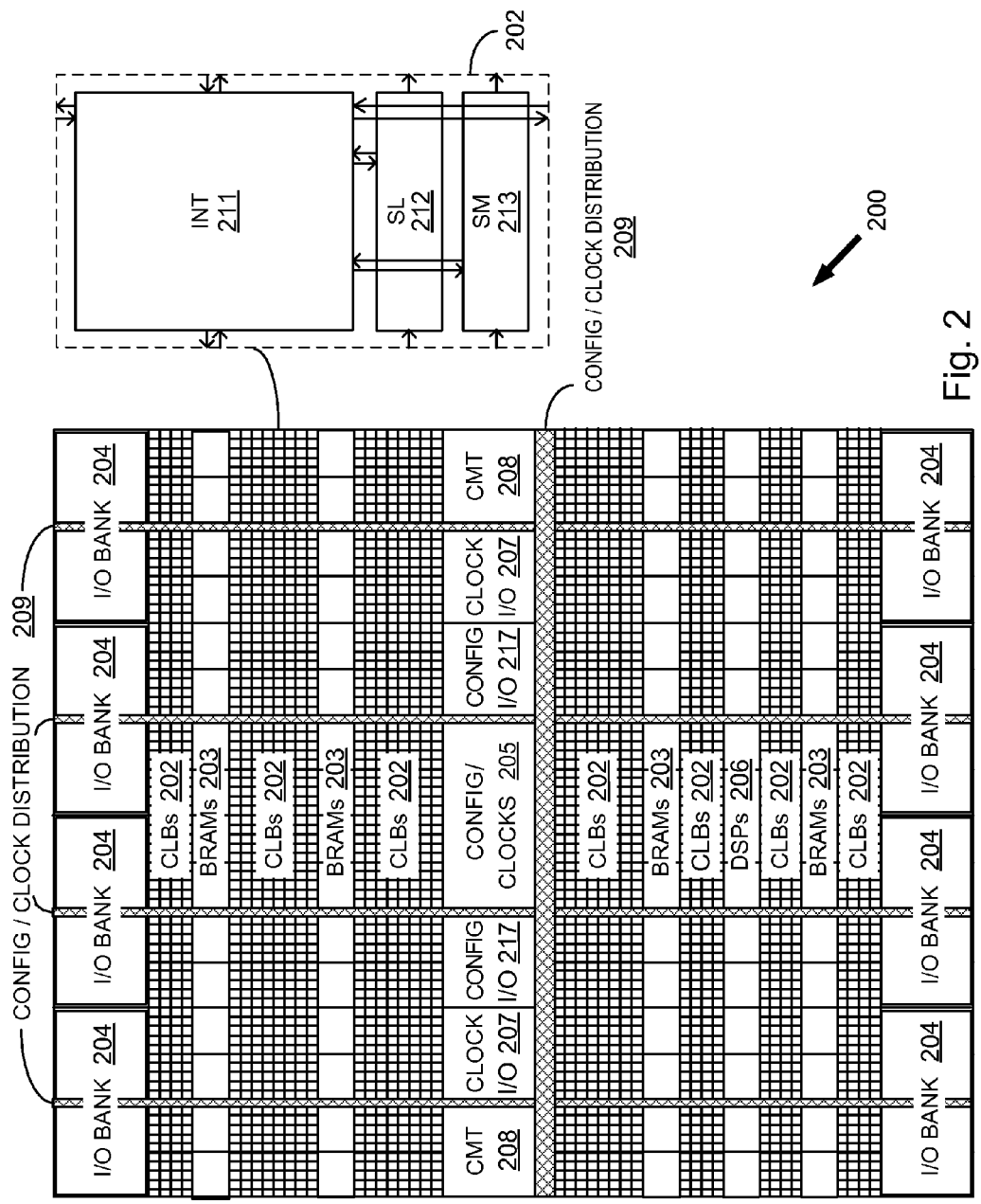
FIG. 2 is a diagrammatic view of another FPGA architecture that is an alternative embodiment of and uses the same general architecture as the FPGA of FIG. 1, and that includes several different types of programmable logic blocks.

FIG. 2 is a diagrammatic view of another FPGA architecture 200 that is an alternative embodiment of and uses the same general architecture as the FPGA of FIG. 1, and that includes several different types of programmable logic blocks. The FPGA 200 of FIG. 2 includes CLBs 202, BRAMs 203, I/O blocks divided into "I/O Banks" 204 (each including 40 I/O pads and the accompanying logic), configuration and clocking logic 205, DSP blocks 206, clock I/O 207, clock management circuitry (CMT) 208, configuration I/O 217, and configuration and clock distribution areas 209.

In the FPGA 200 of FIG. 2, an exemplary CLB 202 includes a single programmable interconnect element (INT) 211 and two different "slices", slice L (SL) 212 and slice M (SM) 213. In some embodiments, the two slices are the same (e.g. two copies of slice L, or two copies of slice M). In other embodiments, the two slices have different capabilities. In some embodiments, some CLBs include two different slices and some CLBs include two similar slices. For example, in some embodiments some CLB columns include only CLBs with two different slices, while other CLB columns include only CLBs with two similar slices.

Figure 3:
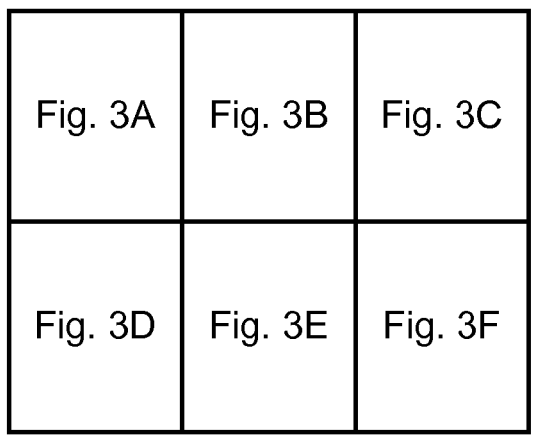
FIG. 3 is a block diagram showing an apparatus in the form of a circuit that includes the FPGA of FIG. 1 and a dynamic random access memory (DRAM), the FPGA including a memory controller circuit.
Figure 3D:
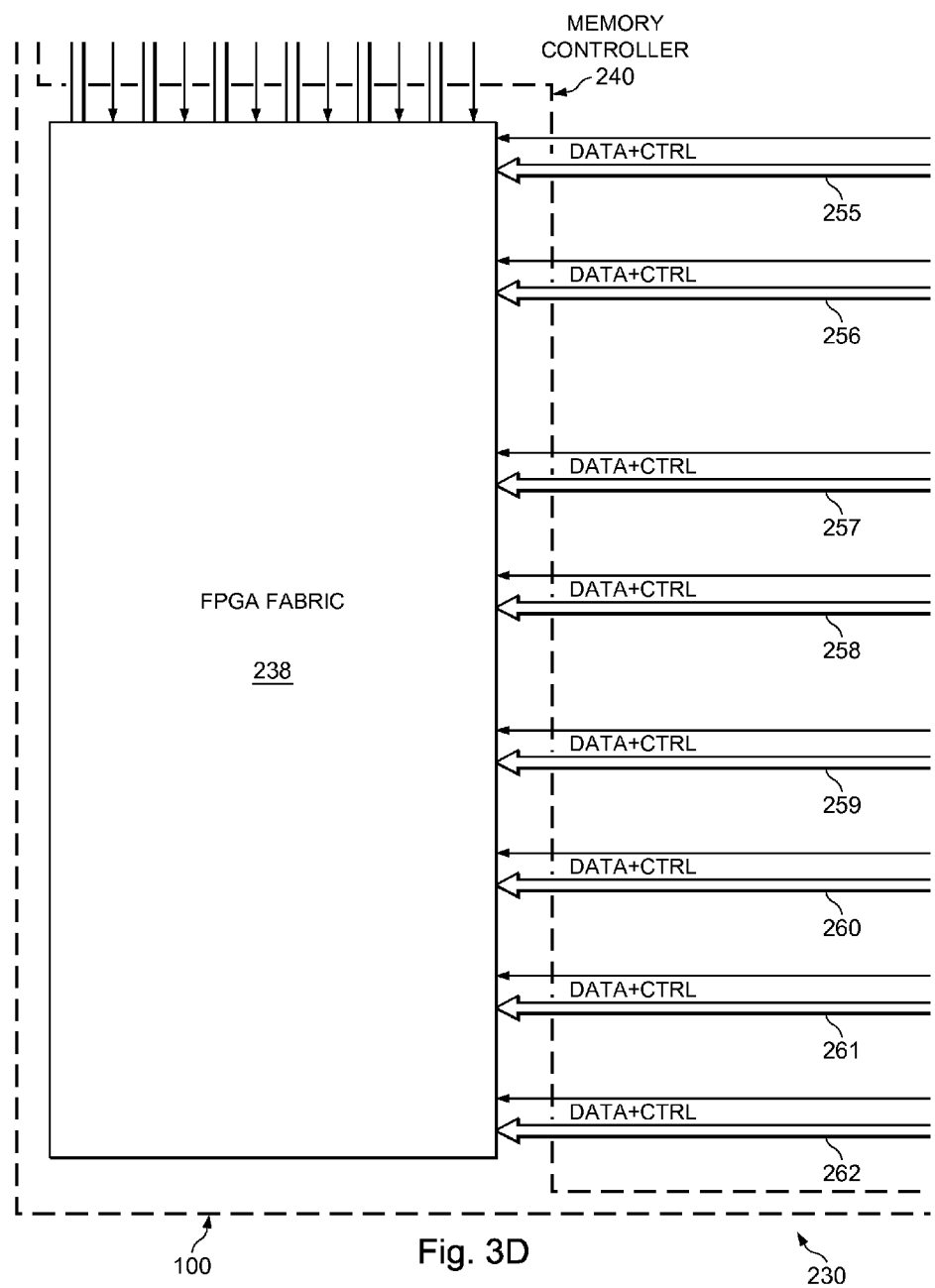
Figure 3E:
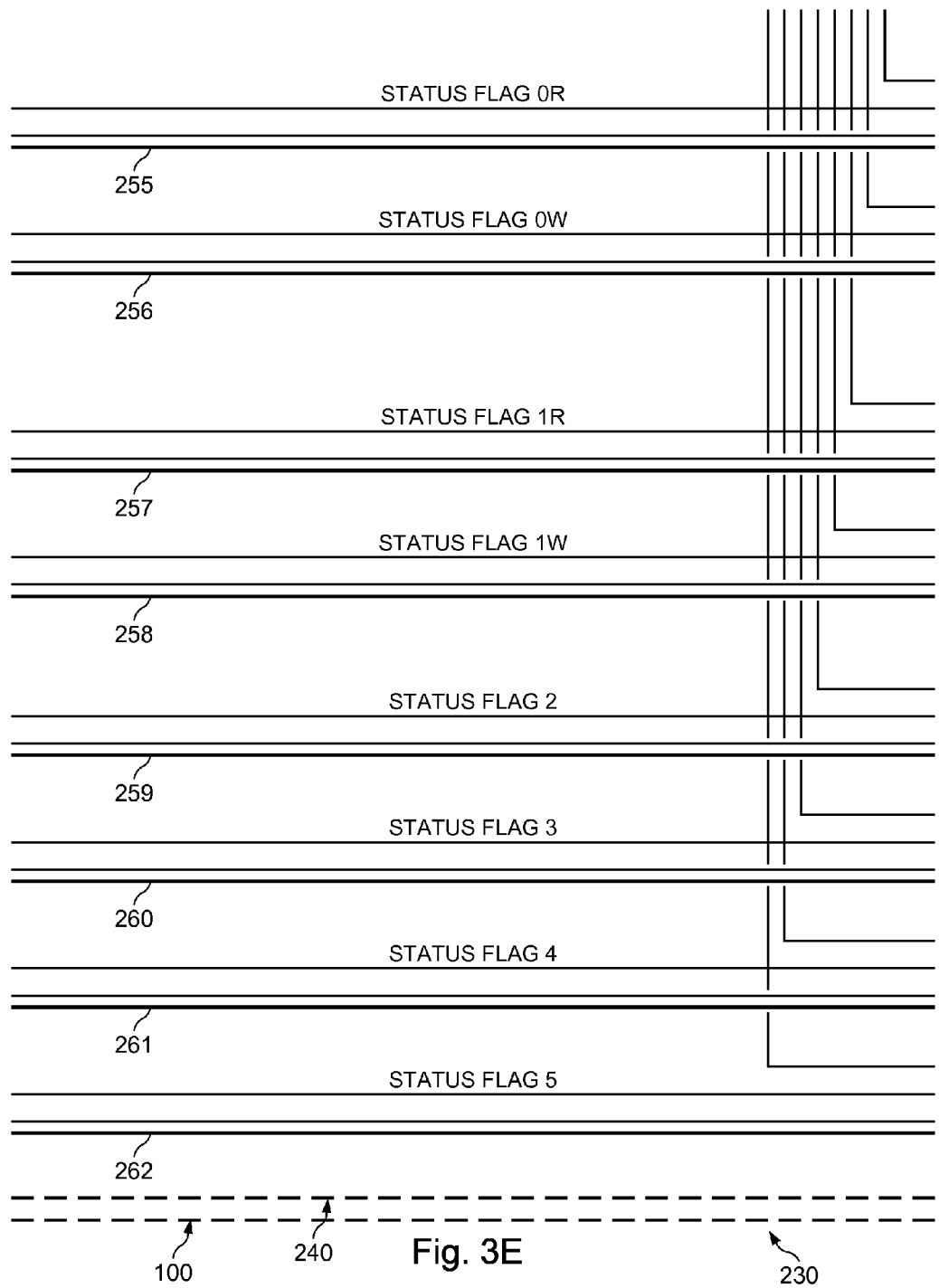
Figure 3F:
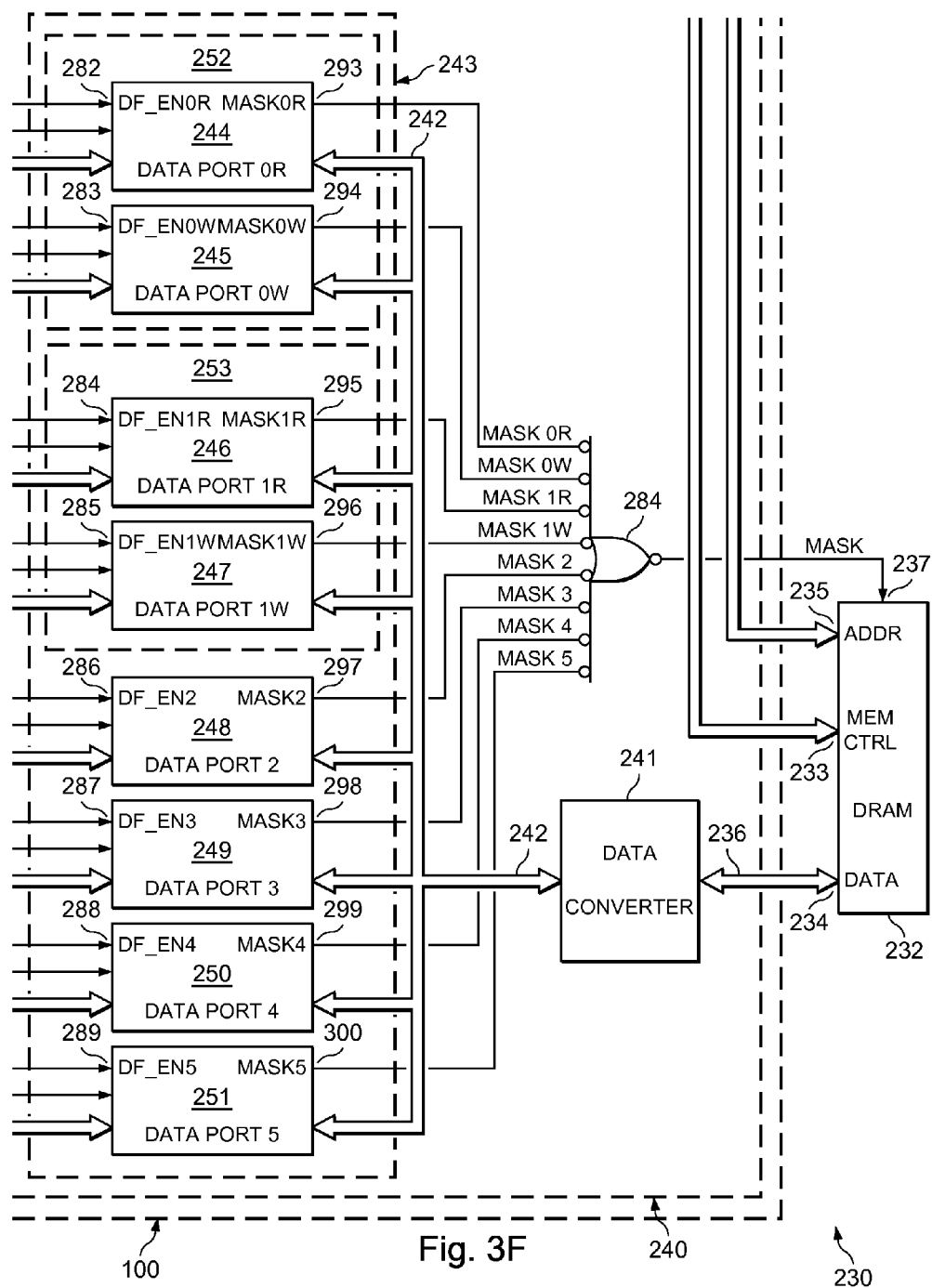

FIG. 3 (which includes FIGS. 3A-3F) is a block diagram showing an apparatus 230 in the form of a circuit that includes the FPGA 100 (FIG. 1) and a dynamic random access memory (DRAM) 232. The FPGA in FIG. 3 can alternatively be the FPGA 200 of FIG. 2. FIG. 3 does not show everything in the FPGA 100. FIG. 3 shows only portions relevant to the embodiment of the invention.

The DRAM 232 is a standard double data rate (DDR) device with a standard memory interface. Alternatively, the DRAM 232 could be a memory of a different double data rate type (DDR2 or DDR3) or low power double data rate (LP-DDR or mobile DDR). Alternatively, the DRAM 232 could be any of a variety of other memory devices. For example, the DRAM 232 can be a memory of the type known as single data rate (SDR). The memory interface of the DRAM 232 includes a memory control input 233 for receiving MEM CTRL signals, a data interface 234 for receiving and outputting data, and an address input ADDR 235 that receives a memory address. The data interface 234 is coupled to a data bus 236. The DRAM 232 also includes an input 237 for receiving a signal MASK. As discussed in more detail later, the signal MASK is used to advise the DRAM 232 to ignore portions of a memory access that are not to be written.

The DRAM 232 has a DRAM PIN_COUNT that is 8 bits, that is the width of each memory location in the DRAM, and that is the width of the data interface 234 of the DRAM 232. In alternative embodiments the DRAM PIN_COUNT can be 4 or 16 bits, or any other suitable number of bits. In addition, the DRAM 232 has a memory burst length DRAM_BL of 8 words. DRAM_BL is the number of word access time slots in each memory access carried out by the DRAM 232, where one 8-bit word or memory location can be accessed during each access time slot. In other words, during each memory access, the DRAM 232 has 8 time slots during which it can read eight 8-bit words for a READ command or write eight 8-bit words for a WRITE command. As a practical matter, during a WRITE command, less than 8 words may actually be written into the memory (as discussed in more detail later), but all 8 time slots still occur. Alternatively, the memory burst length can be 4 words, or any other number of words. For each memory access, the DRAM 232 accesses up to eight 8-bit words, or 64 bits in total. Accordingly, a data transfer sequence involving an integer multiple of memory access cycles is needed for data transfers greater than 64 bits.

The DRAM 232 is conceptually divided into a series of contiguous blocks each equal in size to the DRAM_BL and thus having 64 bits, and each having respective start and end memory address boundaries. READ and WRITE accesses each need to start and end on a boundary. In instances where either the start or end memory address of a READ or WRITE command does not coincide with a boundary, the system ignores portions of memory blocks that are accessed during a READ. In addition, specifically for WRITE commands, the signal MASK is used to tell the DRAM 232 to ignore selected locations of a memory access that are not to be written.

In more detail, there are four different data transfer scenarios with regard to memory address boundaries. For example, a data transfer may have start and end memory addresses that each coincide with a memory boundary. In this case, no masking is needed. In another scenario, a data transfer may have a start memory address that is aligned with a memory boundary and an end memory address that falls between memory boundaries. In this case, post-masking is carried out to ignore memory locations between the end memory address and the closest subsequent memory address boundary. In yet another scenario, a data transfer may have a start memory address that falls between memory boundaries and an end memory address that is aligned with a memory address boundary. In this case, pre-masking is carried out to ignore memory locations between the start memory address and the closest previous memory address boundary. In a further scenario, a data transfer may have start and end memory addresses that each fall between memory boundaries. In this case, both pre-masking and post-masking are needed.

The FPGA 100 includes an FPGA fabric 238 and a memory controller 240 that is a data transfer portion. In regard to data to be written into or read from the DRAM 232, the FPGA fabric 238 is configurable for transfers of data having one or more predetermined word widths. For example, the FPGA fabric 238 can be configured to receive and transmit data having a word width of 32, 64, or 128 bits. Alternatively, the FPGA fabric 238 could be designed to receive or transmit words having a width of any other number of bits. In addition, in some instances the FPGA fabric 238 can be configured to receive and transmit data having one word width that is one of 32, 64, and 128 bits, and having another word width that is a different one of 32, 64, and 128 bits. The memory controller 240 facilitates transfer of data between the FPGA fabric 238 and the DRAM 232. The memory controller 240 includes memory cells 239 that are configurable structure. The memory cells 239 store information about the DRAM 232 and the memory controller 240. In particular, the memory cells 239 store the memory burst length DRAM_BL and the pin count DRAM PIN_COUNT of the DRAM 232. Also, the memory cells 239 include data port configuration information for data ports that are in the memory controller 240 as well as priority information relating to command ports (command port priorities), described in further detail below. The information stored in the memory cells 239 is specified by a user during field programming of the FPGA.

The memory controller 240 includes a portion that is a data converter 241. The data converter 241 has an interface that is coupled to the data bus 236. Also, the data converter 241 has another interface that is coupled to a data bus 242 that is 32 bits wide. In general, when the DRAM 232 is a DDR device, the data converter 241 converts data to and from DDR format data for WRITE and READ data transfers between the memory controller 240 and the DRAM 232. For a WRITE data transfer, the data converter 241 takes each word received from other circuitry within the memory controller, configures it as DDR data by splitting it into two halves, and then successively passes the two halves on to the DRAM 232. For a READ data transfer, the data converter captures each data word output by the DRAM 232, and synchronizes it to an internal clock signal of the memory controller 240. The data converter 241 takes two successive data words from the DRAM 232 (DDR data), and combines them into a single larger data word that the data converter then passes on to other circuitry within the memory controller.

In further detail, and as discussed above, the DRAM 232 in the disclosed embodiment has a pin count of 8 bits. With respect to data transfers between the DRAM 232 and the data converter 241, 8 bits of data are transferred on each edge of each pulse of a not-illustrated DQS signal. Accordingly, a total of 16 bits of data is transferred between the data converter 241 and the DRAM 232 on each pulse of the DQS signal. Therefore, for a READ data transfer the data converter 241 combines two 8-bit data words into a single 16-bit data word that is then passed on to other circuitry within the memory controller 240 over the data bus 242. For a WRITE data transfer, the data converter 241 takes each 16-bit data word arriving over the data bus 242 and divides it into two 8-bit data words (DDR data) that are successively sent to the DRAM 232 over the data bus 236.

In an alternative example the DRAM 232 can be a memory of the type known as a single data rate (SDR) device. Under that example, for both READ and WRITE data transfers, the data converter 241 does not alter data that passes through it.

The memory controller 240 includes a data storage portion 243 that is coupled between the FPGA fabric 238 and the data converter 241, and that is configurable by a user during field programming of the FPGA. The data storage portion 243 temporarily stores data that is being transferred between the FPGA fabric 238 and the DRAM 232. The data storage portion 243 includes eight independently controlled data ports 244-251 that are each a first-in-first-out (FIFO) storage device that serves as a storage element. Each of the data ports 244-251 can store up to 64 words that are each 32 bits. In addition, the data ports 244-251 can be configured for concatenation. For example, two or four of the data ports 244-251 can be concatenated to store 64-bit or 128-bit words. So in general, the data storage portion 243 can be configured to have only 32-bit data ports, a combination of 32-bit and 64-bit data ports, only 64-bit data ports, or only 128-bit data ports. In this manner, the memory controller 240 is configurable for facilitating transfer of FPGA data words having 32, 64, and 128 bits.

The data ports 244 and 246 provide for unidirectional storage for data transfers from the DRAM 232 to the FPGA fabric 238 (READ). The data ports 245 and 247 provide for unidirectional storage for data transfers from the FPGA fabric 238 to the DRAM 232 (WRITE). The pair of data ports 244 and 245 and the pair of data ports 246 and 247 form respective bidirectional dual data ports 252 and 253. The data ports 248-251 also provide for unidirectional storage and are configurable for temporarily storing either READ or WRITE data transfers. The ports 248-251 must each be designated as either a read port or a write port during user configuration, and that designation does not thereafter change. Accordingly, there are a variety of possible configurations of the data storage portion 243.

In more detail, in one configuration the data storage portion 243 is configured to have only 32-bit data storage elements. In this scenario, the data ports 244 and 246 each provide for unidirectional storage for READ data transfers and the data ports 245 and 247 each provide for unidirectional storage for WRITE data transfers. Moreover, the other four data ports 248-251 are independently configured so that each provides unidirectional storage for one of READ data transfers or WRITE data transfers. Thus, the four data ports 248-251 can be configured as (1) four data ports that each provide unidirectional storage for READ data transfers, (2) one data port that provides unidirectional storage for READ data transfers and three data ports that provide unidirectional storage for WRITE data transfers, (3) two data ports that provide unidirectional storage for READ data transfers and two data ports that provide unidirectional storage for WRITE data transfers, (4) three data ports that provide unidirectional storage for READ data transfers and one data port that provides unidirectional storage for WRITE data transfers, or (5) four data ports that each provide unidirectional storage for WRITE data transfers.

In another scenario, the data storage portion 243 is configured to have 64-bit data storage elements. For example, the data ports 244 and 246 can be concatenated and the data ports 245 and 247 can be concatenated to form data storage elements that respectively provide for 64-bit READ and WRITE data transfers. When the data ports 244-247 are concatenated to form 64-bit storage elements, the data ports 248-251 can each be configured to be a 32-bit data port, or the data ports 248-251 can be configured to define two 64-bit storage elements. For example, the data ports 248 and 250 can be concatenated to form a data storage element that provides for 64-bit READ data transfers, and the data ports 249 and 251 can be concatenated to form a data storage element that provides for 64-bit WRITE data transfers. If the data ports 248-251 are concatenated to define two 64-bit storage elements, the data ports 244-247 can be configured as either four 32-bit storage elements or as two 64-bit storage elements.

In yet another scenario, the data storage portion 243 is configured to have only 128-bit storage elements. In this scenario, the data ports 244, 246, 248, and 250 are concatenated and the data ports 245, 247, 249, and 251 are concatenated to form data storage elements that respectively provide temporary storage for 128-bit READ and WRITE data transfers.

As one example of a specific configuration that will facilitate the discussion that follows, assume that in FIG. 3 the data storage portion 243 is configured to provide for a combination of 32-bit and 64-bit data storage elements. In particular, assume that the data ports 244 and 246 are concatenated and the data ports 245 and 247 are concatenated to form two 64-bit storage elements that respectively provide temporary storage for READ and WRITE data transfers. In addition, assume the data ports 248 and 250 are each configured to provide temporary 32-bit storage for READ data transfers, while the data ports 249 and 251 are each configured to provide temporary 32-bit storage for WRITE data transfers.

Each of the data ports 244-251 produces a status flag signal STATUS FLAG that is supplied to the FPGA fabric 238. In particular, status flag signals STATUS FLAG 0R, STATUS FLAG 0W, STATUS FLAG 1R, STATUS FLAG 1W, STATUS FLAG 2, STATUS FLAG 3, STATUS FLAG 4, and STATUS FLAG 5 are respectively produced by the data ports 244-251. Each STATUS FLAG signal indicates when the associated data port is empty if that data port is configured for READs, or indicates when that data port is full if it is configured for WRITEs. If two or four data ports are concatenated, then only one STATUS FLAG corresponding to the last of those concatenated data ports is actually used. For example, in the configuration of FIG. 3, the signal STATUS FLAG 1R for data port 246 is used to indicate when concatenated data ports 244 and 246 are empty, while STATUS FLAG 0R for data port 244 is ignored. Similarly, the signal STATUS FLAG 1W for data port 247 is used to indicate when concatenated data ports 245 and 247 are full, while STATUS FLAG 0W for data port 245 is ignored. Each of the STATUS FLAGs from the data ports 248 and 250 indicates when that data port is empty. Also, each of the STATUS FLAGs from the data ports 249 and 251 indicates when that data port is full. Each of the data ports 244-251 is coupled to a respective one of eight bidirectional buses 255-262 that each provide control signals and 32 bits of data between the data port and the FPGA fabric 238. Each of the buses 255-262 and the associated STATUS FLAG signal serves as an interface between the fabric 238 and a respective one of the data ports 244-251. Each of the data ports 244-251 is also coupled to the common data bus 242 that is 32 bits wide. Also, the data ports 244-251 have respective enable inputs 282-289 for receiving respective active-high enable signals DF_EN 0R, DF_EN 0W, DF_EN 1R, DF_EN 1W, DF_EN 2, DF_EN 3, DF_EN4, and DF_EN 5. Each of these enable signals independently enables a respective data port 244-251 for storing or retrieving data.

Each of the data ports 244-251 has a respective one of eight mask outputs 293-300 at which it can produce a respective one of eight active-high signals MASK 0R, MASK 0W, MASK 1R, MASK 1W, MASK 2, MASK 3, MASK 4, and MASK 5. These signals depend on the respective enable signals. For example, consider data port 244. If the enable signal DF_EN 0R that is received at the enable input 282 is asserted, the mask signal MASK 0R at the mask output 293 is set to a logic low. Conversely, if the enable signal DF_EN 0R that is received at the enable input 282 is deasserted, the mask signal MASK 0R at the mask output 293 is asserted to a logic high. The memory controller 240 also includes an eight-input NOR gate 284 with 8 inverting inputs that are coupled to the mask outputs 293-300 of the data ports 244-251. The NOR gate 284 outputs a signal MASK that is supplied to the mask input 237 of the DRAM 232.

An explanation is now provided of the operation of the data storage portion 243 for a data transfer of a 64-bit word from the FPGA fabric 238 to the DRAM 232 (memory WRITE). As discussed above, it is being assumed for the sake of this discussion that data ports 245 and 247 are concatenated to form a 64-bit storage element. Assume that the 64-bits of data are to be supplied through the 64-bit data storage element defined by the concatenated ports 245 and 247. The FPGA fabric 238 first checks the signal STATUS FLAG1W from data port 247 in order to determine whether data ports 245 and 247 are currently full. If they are, then the fabric 238 waits. Otherwise, the fabric 238 can put data in the concatenated data ports 245 and 247. More specifically, the FPGA fabric 238 transfers a first half of the 64-bits in parallel across the data bus 255 and into the data port 245, while simultaneously transferring the second half of the 64 bits in parallel across the data bus 256 and into the data port 247. Later, the data ports 245 and 247 are sequentially enabled so that the 32 bits of data stored in each of those data ports are sequentially transferred across the data bus 242 and into the data converter 241 in successive groups of sixteen bits. As previously discussed, the data converter 241 splits each 16-bit word into two 8-bit words that are then transferred successively across the data bus 236 and into the DRAM 232.

In greater detail, first the enable signal DF_EN 0W is asserted to enable the data port 245 so that the 32 bits in that data port are transferred in two successive groups of sixteen bits to the data converter 241. The data converter 241 divides each 16-bit data word received from the data port 245 into a pair of 8-bit data words that conform with the DDR standard, and then successively transfers these two 8-bit data words over the data bus 236 to the DRAM 232. The data port 245 is enabled until all 32 bits have been transferred. Then, the enable signal DF_EN 0W is deasserted to disable the data port 245, and the enable signal DF_EN 1W is asserted to enable the data port 247 so that the 32 bits in that data port are transferred in two successive groups of sixteen bits over the data bus 242 and into the data converter 241. The data converter 241 divides each group of 16-bit data words received from the data port 247 into a pair of 8-bit data words that conforms with the DDR standard and transfers the resulting DDR data over the data bus 236 to the DRAM 232. The data port 247 is enabled until all 32 bits have been transferred. This is one example of how data is transferred from the FPGA fabric 238 to the DRAM 232.

An explanation is now provided of the operation of the data storage portion 243 for a data transfer of 64 bits of data from the DRAM 232 to the FPGA fabric 238 (READ). As discussed above, it is being assumed for the sake of this discussion that data ports 244 and 246 are concatenated to form a 64-bit storage element. Assume that the FPGA fabric 238 decides the 64-bit data storage element defined by the concatenated data ports 244 and 246 is to be used for the transfer. The DRAM 232 supplies the data converter 241 the 64 bits of data in four successive pairs of 8-bit words. Then, as previously explained, the data converter 241 combines the incoming successive pairs of 8-bit words into four 16-bit words and supplies the 64 bits of data to the data ports 244 and 246 in successive words or groups of 16 bits over the data bus 242. The enable signals DF_EN 0R and DF_EN 1R are sequentially asserted so that the data ports 244 and 246 are sequentially enabled to store the data. First the enable signal DF_EN 0R is asserted so that the data port 244 receives data over the bus 242 in two successive groups of sixteen bits until the 32-bit width of the data port 244 is filled. When the width of the data port 244 is full, the enable signal DF_EN 0R is deasserted so that the data port 244 is disabled. Then the enable signal DF_EN 1R is asserted so that the data port 246 is enabled and can receive the next 32 bits of data from the DRAM 232 in two successive groups of sixteen bits over the data bus 242. Thus, during the data transfer, two successive pairs of 8-bit memory words from the DRAM 232 are each combined by the data converter 241 to form two 16-bit groups and placed in the data port 244, and two more successive pairs of 8-bit memory words from the DRAM 232 are each combined by the data converter 241 into two 16-bit groups and placed in the data port 246. This is one example of how data is loaded into the storage portion 243 during a READ transfer. This data is temporarily stored in the data storage portion 243 until the FPGA fabric 238 retrieves it. In this regard, the signal STATUS FLAG 1R from data port 246 indicates to the fabric 238 whether the concatenated data ports 244 and 246 are empty or contain data. If STATUS FLAG 1R indicates they contain data, then in due course the FPGA fabric 238 retrieves this data from the data ports 244 and 246 in a manner so that all 64-bits are simultaneously transferred in parallel from the data ports 244 and 246 to the fabric over the two respective buses 255 and 257.

The memory controller 240 further includes a command storage portion 306 that is coupled to the FPGA fabric 238. In particular, the command ports 309-314 each have an input that is coupled to a respective one of six command data lines (CMD 0, CMD 1, CMD 2, CMD 3, CMD 4, and CMD 5) that are coupled to the FPGA fabric 238. The command storage portion 306 receives commands from the FPGA fabric 238 that call for transfer of data between the FPGA fabric 238 and the DRAM 232. The command storage portion 306 includes six command ports 309-314, including one command port for each of the bidirectional dual data ports 252 and 253, and one command port for each of the other data ports 248-251. The command ports 309-314 are FIFOs that can store up to 4 commands each, for later processing by the memory controller 240.

The command ports 309-314 each have an input for receiving a respective one of six active-high signals CMD STATUS FLAG 0, CMD STATUS FLAG 1, CMD STATUS FLAG 2, CMD STATUS FLAG 3, CMD STATUS FLAG 4, and CMD STATUS FLAG 5. Each of these signals indicates to the associated command port that a command has just been read from that command port. Moreover, the command ports 309-314 each have an output that provides a respective one of six active-high signals FULL FLAG 0, FULL FLAG 1, FULL FLAG 2, FULL FLAG 3, FULL FLAG 4, and FULL FLAG 5 to the FPGA fabric 238 to indicate when that command port is full. In addition, the command ports 309-314 each have an output that provides a respective one of six active-high signals EMPTY FLAG 0, EMPTY FLAG 1, EMPTY FLAG 2, EMPTY FLAG 3, EMPTY FLAG 4, and EMPTY FLAG 5. Each of these EMPTY FLAG signals indicates when the corresponding command port is empty.

The priorities stored in the memory cells 239 inform the memory controller 240 of a user-specified order in which the command ports should be polled and read. In the course of operation of the memory controller 240, the command ports are checked in the order that is specified by the command priorities, and the first command port that is not empty is selected. In that regard, the memory controller 240 includes a command selector 318 that is a six-to-one selector for selecting one of the six command ports 309-314. The command selector 318 has six inputs that are each coupled to a respective one of the command ports 309-314, a select input that receives a 3-bit select signal CMD_PORT_SEL, and an output for supplying a selected command CMD.

The memory controller 240 includes a controller core 319 that is coupled between the command selector 318 and the DRAM 232. The controller core 319 includes a command request output 320 that outputs a signal CMD REQ for requesting that a command be read from the command storage portion 306, as discussed in more detail later. The controller core 319 also has an input 321 that receives a signal CMD IN. The signal CMD IN indicates that a command is currently being read from the command storage portion 306. The controller core 319 further includes a command input 324 that is coupled to the output of the selector 318, and that receives a command CMD. In addition, the controller core 319 includes a command count input 325 that receives a signal CMD_CNT. The signal CMD_CNT is received when a command is being read from the command storage portion 306, and indicates the total number of memory access cycles that should be executed by the DRAM 232 to carry out the data transfer request in the selected command. The controller core 319 also includes a FIFO 328 that is a storage section for temporarily storing information about each command received from the output of the command selector 318. The FIFO 328 stores up to 4 words, and therefore can store information related to up to 4 commands received from the output of the command selector 318. This information is later used by the controller core 319 when executing those commands. For example, for each command, the FIFO 328 stores a memory address from the command and information indicating whether the command is a read or write request. Also, the FIFO 328 stores the CMD_CNT value provided for that command at the command count input 325.

The controller core 319 has outputs that supply control and addressing signals to the DRAM 232 for execution of a command. In particular, the controller core 319 includes a memory control output 329 that supplies the signals MEM CTRL to the memory control input 233 of the DRAM 232. Moreover, the controller core 319 includes a memory address output ADDR 330 that supplies a memory address to the memory address input ADDR 235 of the DRAM 232. In addition, the controller core 319 includes an output 331 at which it produces a memory read enable signal MEMORY READ EN that is actuated at the start of a memory READ. Also, the controller core 319 includes an output 332 at which it produces a memory write enable signal MEMORY WRITE EN that is actuated at the start of a memory WRITE.

In the course of operation, the controller core 319 requests a command by producing the signal CMD REQ at the output 320. In due course, the controller core 319 receives the signal CMD IN at the input 321, which indicates that a command is being read from the command storage portion 306 and is arriving at the command input 324 of the controller core 319. The controller core 319 also receives the signal CMD_CNT at its input 325. The controller core 319 stores in its FIFO 328 some of the information from the command that is read in, along with the CMD_CNT value, as discussed above. The controller core 319 repeats this process, storing information and CMD_CNT values for up to four different commands. Meanwhile, the controller core 319 is separately and independently executing commands as they reach the end of the FIFO 328. At any time, when the controller core 319 is ready to execute a command that has reached the end of the FIFO 328, the controller core 319 uses the information about the command from the FIFO 328 to supply the appropriate addressing and control signals to the DRAM 232.

The memory controller 240 includes an arbiter 338 that determines the order that commands are executed based on the priority information stored in the memory cells 239. Also, the arbiter 338 controls the data ports 244-251 to cause them to partially assemble and disassemble data that is being transferred between the FPGA fabric 238 and the DRAM 232, as outlined earlier.

The arbiter 338 is coupled to the command storage portion 306, the command selector 318, the memory cells 239, the controller core 319, and the data storage portion 243. The arbiter has a set of inputs 343-346 that are coupled to the memory cells 239 and that respectively receive the memory burst length DRAM_BL, the memory pin count DRAM PIN_COUNT, the data port configuration, and the command priorities. The arbiter 338 also has a set of command port empty flag inputs 350-355 that each receive a respective one of the EMPTY FLAG signals from the command ports 309-314. These signals let the arbiter know whether or not each of the command ports 309-314 is empty. In addition, the arbiter 338 includes a command request input 359 that receives the signal CMD REQ from the command request output 320 of the controller core 319. In response to receiving the signal CMD REQ from the controller core 319, the arbiter 338 selects and reads a command from the command storage portion 306, as discussed below.

The arbiter 338 includes a command port select output 360 for supplying the select signal CMD_PORT_SEL to the control input of the six-to-one selector 318. The signal CMD_PORT_SEL selects which one of the command ports 309-314 should be read based on the command port priorities that are stored in the memory cells 239 and on the EMPTY FLAG signals. The handling of priorities is discussed in more detail later.

The arbiter 338 further includes a command input 361 that is coupled to the output of the selector 318, and that receives the selected command CMD. Moreover, the arbiter 338 includes some FIFOs 362 that store information about a command received at the command input 361, and other information determined by the arbiter, discussed in more detail later. Each of the FIFOs 362 can store up to 4 words.

In addition, the arbiter 338 includes a set of command port status outputs 364-369 that each supply a respective one of the six signals CMD STATUS FLAGS 0-5 to a respective one of the command ports 309-314. In addition, the arbiter 338 has an output 375 that supplies the signal CMD IN to the controller core 319 to indicate that a command is being read from the command storage portion 306. Moreover, the arbiter 338 includes a command count output 376 that supplies the CMD_CNT value to the command count input 325 of the controller core 319.

The arbiter 338 includes a memory read enable input 381 that is coupled to the memory read enable output 331 of the controller core 319 and receives the signal MEMORY READ EN. In addition, the arbiter 338 includes a memory write enable input 382 that is coupled to the memory write enable output 332 of the controller core 319 and receives the signal MEMORY WRITE EN. The arbiter further includes a SUBPORT FIFO 383 that stores the addresses of selected data ports 244-251 that are currently being used for a data transfer. The SUBPORT FIFO 383 is 4 words deep, and therefore can store up to four addresses. For example, in a 32-bit data transfer, only one of the 32-bit data ports 244-251 is used and the SUBPORT FIFO 383 stores only one data port address. In a 64-bit data transfer, two of the 32-bit data ports 244-251 are used and the SUBPORT FIFO 383 stores two data port addresses. In a 128-bit data transfer, four of the 32-bit data ports are used and thus the SUBPORT FIFO 383 stores four data port addresses.

The arbiter 338 also includes a set of enable outputs 391-398 that are each coupled to a respective one of the data ports 344-251, and that each carry a respective one of the enable signals DF_EN 0R, DF_EN 0W, DF_EN 1R, DF_EN 1W, DF_EN 2, DF_EN 3, DF_EN4, and DF_EN 5.

In operation, the arbiter 338 receives a command request signal CMD_REQ from the controller core 319. The command request signal CMD_REQ prompts the arbiter 338 to read a command CMD from the command storage portion 306. In more detail, the arbiter 338 selects a command port from the command storage portion 306 via the selector 318. The selection is based on the command priorities that are stored in the memory cells 239, and the signals EMPTY FLAG 0-5 that are received at the inputs 343-346. In particular, the arbiter 338 goes through the EMPTY FLAG signals from the command ports in a predetermined sequence that is defined by the command priorities, and selects the first command port that is not empty.

When a command is read from the command storage portion 306, the command CMD is supplied to the output of the selector 318. That command CMD arrives at the command input 361 of the arbiter 338. The arbiter 338 extracts certain information from the command CMD and stores that information in the FIFOs 362. For example, from the command CMD, the arbiter 338 extracts a portion of the memory address, a user burst length that is the amount of data requested to be transferred, and the address of the data port through which the data is to be transferred. In addition, the arbiter 338 generates masking information (discussed in greater detail later) that is stored in the FIFOs 362 and that indicates whether it is necessary to ignore portions of memory blocks that are accessed in carrying out a data transfer. Also, the arbiter 338 sends the controller core 319 the signal CDM IN to indicate to the controller core 319 that a command is being read in. Moreover, the arbiter 338 generates and sends the value CMD_CNT to the controller core 319 for that command. In addition, after a command has been read in, the arbiter 338 actuates a respective one of the signals CMD STATUS FLAG 0-5 to advise the selected command port that a command has been read from that command port. After one or more commands have been read by the arbiter 338, the arbiter waits for one of the signals MEMORY READ EN and MEMORY WRITE EN to go high. If the signal MEMORY READ EN goes high, the arbiter 338 facilitates a read transfer, as discussed in more detail later. If the signal MEMORY WRITE EN goes high, the arbiter 338 facilitates a write transfer, as discussed in more detail later.

A high-level description of the operation of the entire memory controller 240 is now provided. The memory controller 240 facilitates transfer of data between the FPGA fabric 238 and the DRAM 232. Recall that the DRAM 232 has a burst length of 8 words and the width of the DRAM is 8 bits. Also recall that, for purposes of this discussion, it is being assumed that the data port configuration is such that the data ports 244 and 246 are concatenated for 64-bit read transfers, the data ports 245 and 247 are concatenated for 64-bit write transfers, data ports 248 and 250 are each separately configured for 32-bit read transfers, and data ports 249 and 251 are each configured for 32-bit write transfers. Before providing a write command to the command storage portion 306, the FPGA fabric 238 loads the data to be transferred in the appropriate data ports. For example, the FPGA fabric looks at the STATUS FLAG signal from the particular data port that is to be used to temporarily store data for the transfer. When the STATUS FLAG is asserted the corresponding data port is full, and the fabric 238 has to wait before providing it with data. When that STATUS FLAG is deasserted, the corresponding data port is available for storing data to be transferred. The FPGA fabric 238 can then supply all of the data to be transferred to the appropriate data port before providing the associated write command to the command storage portion 238.

Consider how the FPGA 238 supplies the command storage portion 306 with commands. The FPGA fabric 238 checks to see if a command port FIFO is full before loading a command in that command port. When any one of the command ports 309-314 is full, its FULL FLAG is asserted so that the FPGA fabric 238 knows that command port is full. The FPGA fabric 238 selectively loads commands into the command ports 309-314 that are not full, as necessary for desired memory reads or writes. In due course, the controller core 319 requests that a command be read in from the command storage portion 306, by supplying the signal CMD REQ to the arbiter 338. In turn, the arbiter 338 selects a command port based on the EMPTY FLAG signals 350-353 and the command priorities in the memory cells 239. For example, as explained earlier, the arbiter 338 selects a command port by going through the EMPTY FLAGS of the command ports in the predetermined sequence that is defined by the command port priorities stored in the memory cells 239, and by selecting the first command port that is not empty. The arbiter 338 accesses the selected command port by sending the select signal CMD_PORT_SEL to the select input of the command selector 318. The selected command is then supplied to the output of the command selector 318.

The command that is supplied to the output of the command selector 318 makes its way to the command inputs 324 and 361 of the controller core 319 and the arbiter 338, respectively. The controller core 319 receives the command at its input 324 and extracts information from that command. Meanwhile, the arbiter 338 receives the same command at its input 361 and also extracts information from the command.

The arbiter uses the DRAM_BL, DRAM PIN_COUNT, and the DATA PORT CONFIGURATION from the memory cells 239, along with some information extracted from the command, to determine masking information and a value CMD_CNT corresponding to that command. After determining the command count CMD_CNT, the arbiter 338 supplies the command count CMD_CNT to the input 325 of the controller core 319. The arbiter 338 then supplies the signal CMD IN to the controller core 319 to indicate that a command is currently being read from the command storage portion 306 and is arriving at the input 324 of the controller core. The controller core 319 stores the CMD_CNT value in the FIFO 328, along with information extracted from the command, such as a starting memory address, and whether the memory access will be a READ or WRITE. Meanwhile, the arbiter 338 stores the mask information it has generated into the FIFOs 326, along with information extracted from the command, such as the user burst length, and the address of the data port that will be used for the transfer. The arbiter 338 sends one of the signals CMD STATUS FLAGs 0-5 to the command port from which the command was read, so that the command port knows that a command has been read from it. This process of filling up the FIFOs 328 and 362 in the controller core 319 and arbiter 338, respectively, can continue for up to four commands.

Meanwhile, in parallel with this process of loading commands into the FIFOs 328 and 362, the controller core 319 and the arbiter 338 are executing commands as commands reach the end of the FIFOs 328 and 362. When a command is executed by the controller core 319 and the arbiter 338, the information previously stored for that command in the FIFOs 328 and 362 is used to execute the command.

The controller core 319 initiates execution of a command by sending the starting memory address to the ADDR input 235 of the DRAM 232, and by sending control signals to the MEM CTRL inputs 233 of the DRAM 232. Moreover, the controller core 319 supplies a read or write enable signal MEMORY READ EN or MEMORY WRITE EN to the arbiter 338 at one of its respective inputs 381 and 382. In response to receiving this signal, the arbiter 338 reads from its FIFOs 362 the information for that command and then loads the SUBPORT FIFO 383 with one or more data port addresses that are to be used for the data transfer. Based on the command and mask information stored in the FIFOs 362, the arbiter 338 selectively asserts the DF_EN signals in a manner so that the data ports being used for that data transfer are enabled at appropriate times.

For a READ data transfer, the DRAM 232 transfers data in successive words of 8 bits each over the data bus 236 and into the data converter 241. Each pair of successive 8-bit words that are supplied to the data converter 241 are combined into a single 16-bit word that is subsequently transferred over the data bus 242 to the data storage portion 243. As the enable signals DF_EN enable the appropriate data port or ports, the data is stored in the data storage portion 243. Eventually, 32 bits of data is stored in each data port being used for the READ transfer. In due course, the FPGA fabric 238 reads the 32 bits of data that is stored in each data port being used for the READ transfer.

For a WRITE data transfer, the arbiter 338 asserts one or more of the enable signals DF_EN enable so that the 32 bits of data in each data port being used for the WRITE transfer are transferred in successive groups of sixteen bits over the data bus 242 and into the data converter 241. Each 16-bit word that is supplied to the data converter 241 is divided into a pair of 8-bit data memory words that are successively transferred over the data bus 236 to the DRAM 232. In some situations the start memory address and/or end memory address of the data being transferred falls on an address that is not on a memory address boundary. In that instance, as to memory locations in the memory access that are before and/or after the locations being written, no data port is enabled, and the signal MASK goes high to tell the DRAM 232 that it should not change data that is already in those memory locations.

Figure 4B:
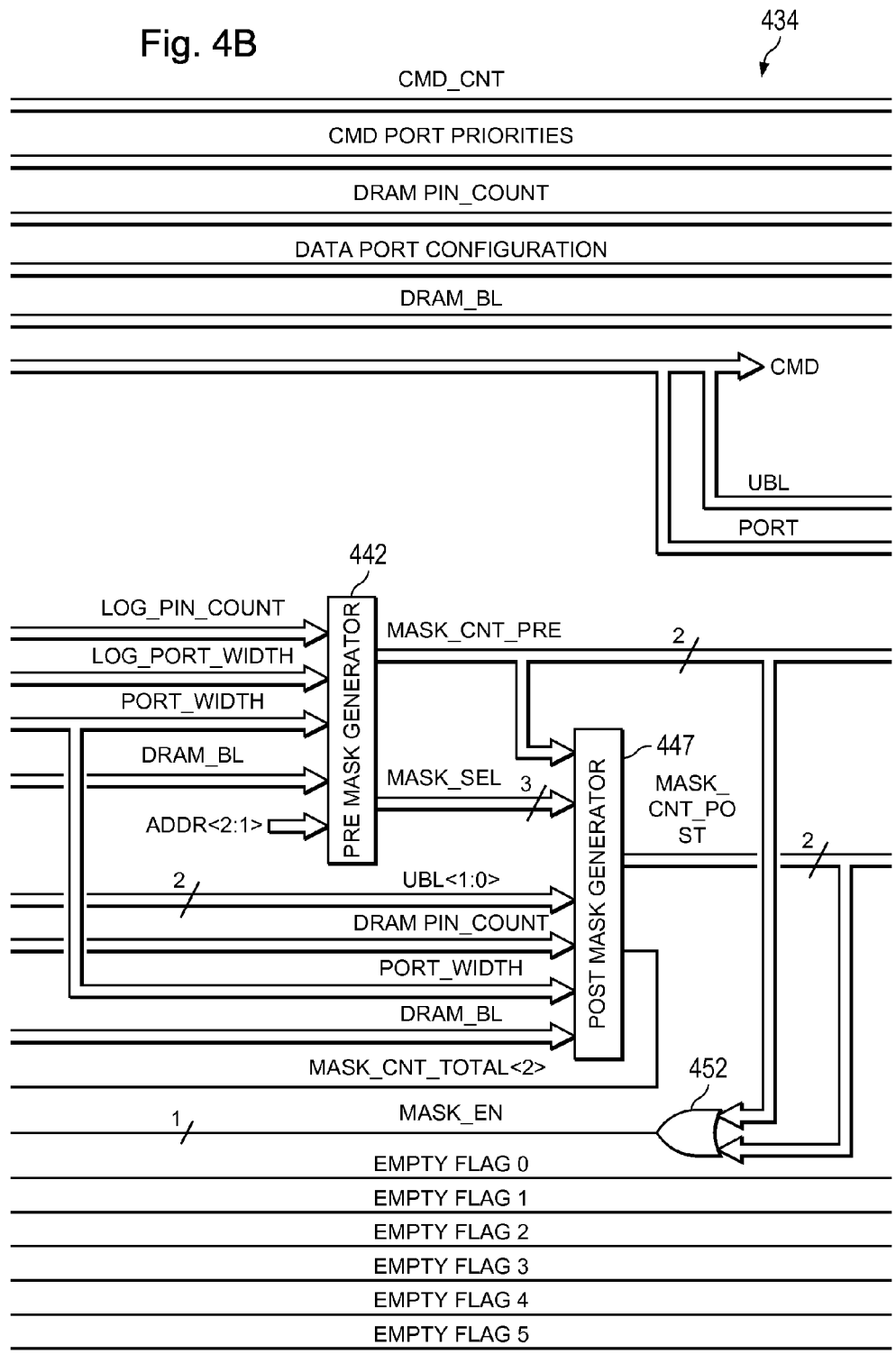
FIG. 4 is a block diagram showing a portion of an arbiter that is a component of the memory controller circuit of FIG. 3.
Figure 4C:
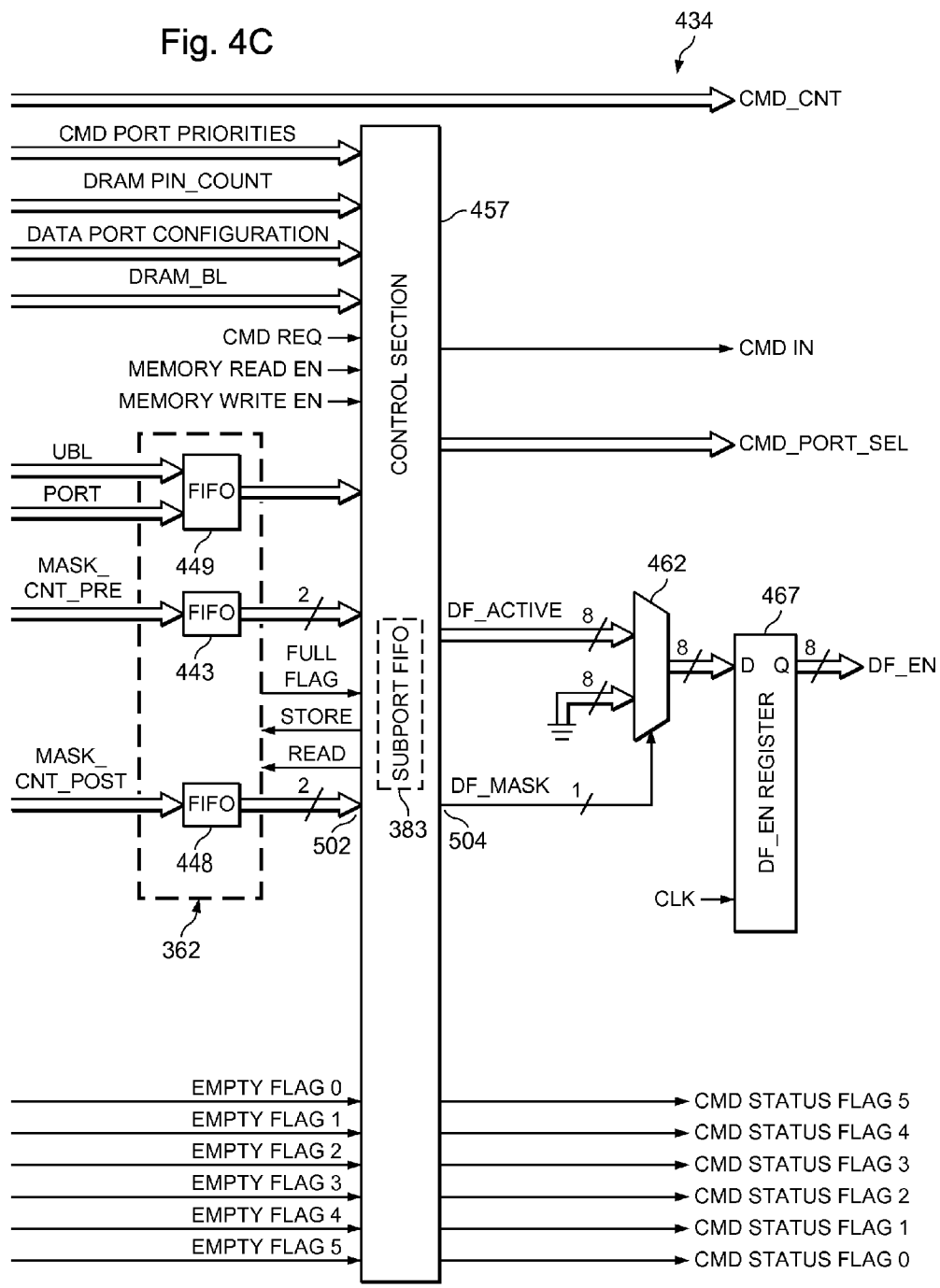

FIG. 4 is a block diagram of a portion 434 of the arbiter 338 in FIG. 3. The portion 434 of the arbiter 338 includes a command count generator 437 that generates a 9-bit value as the command count CMD_CNT that is supplied to an output coupled to the controller core 319 (FIG. 3). The command count generator 437 receives the memory burst length DRAM_BL, the DRAM PIN_COUNT, and the DRAM PORT CONFIGURATION. These three values are supplied by the memory cells 239 (FIG. 3). The command count generator 437 also receives the address (PORT) of a data port that is to be used for the data transfer requested by the current command received at the command input 361 of the arbiter 338. In addition, the command count generator 437 receives a user burst length (UBL). The UBL represents an amount of data to be transferred, and is the actual user burst length less one. The UBL is extracted from the current command that is received at the command input 361 (FIG. 4) of the arbiter 338. Moreover, the command count generator 437 receives a signal MASK_CNT_TOTAL<2> that is the third least significant bit of a signal MASK_CNT_TOTAL that is discussed later.

The command count generator 437 further receives a signal MASK_EN that indicates whether or not some of the memory locations that will be accessed should be ignored. The command count generator 437 formulates and outputs a value LOG_PIN_COUNT that is the base two logarithm of the PIN_COUNT. Moreover, the command count generator 437 formulates and outputs a value PORT_WIDTH that is the width of the data port (PORT) that is being used for the data transfer. In addition, the command count generator 437 further formulates and outputs a value LOG_PORT_WIDTH that is the base two logarithm of the PORT_WIDTH. A more detailed discussion of the command count generator 437 is provided later.

The portion 434 of the arbiter 338 includes a pre-mask generator 442. The pre-mask generator 442 has three different inputs that are each coupled to the command count generator 437 for respectively receiving the values LOG_PIN_COUNT, LOG_PORT_WIDTH, and PORT_WIDTH. The pre-mask generator 442 further receives the memory burst length DRAM_BL from the memory cells 239 (FIG. 3). In addition, the pre-mask generator 442 receives a signal ADDR<2:1> that is the second and third least significant bits of the starting memory address for the data to be transferred. The pre-mask generator 442 generates and outputs a 2-bit signal MASK_CNT_PRE that is supplied to a FIFO 443 that is one of the FIFOs 362, and serves as a storage section. The signal MASK_CNT_PRE represents the number of words that should be ignored between the starting memory address and the nearest preceding memory boundary of the DRAM 232 during a data transfer. The pre-mask generator also formulates a 3-bit signal MASK_SEL that is supplied to another one of its outputs. A more detailed discussion of the pre-mask generator 442 is provided later.

The portion 434 of the arbiter 338 also includes a post-mask generator 447 that receives the signals MASK_COUNT_PRE and MASK_SEL from the pre-mask generator 442. The post-mask generator 447 further receives a 2-bit signal UBL<1:0> that includes the two least significant bits of the user burst length. Moreover, the post-mask generator 447 further receives the DRAM_PIN_COUNT and the DRAM_BL from the memory cells 239 (FIG. 3). In addition, the post-mask generator 447 receives the value PORT_WIDTH from the command count generator 437.

The post-mask generator 447 formulates and outputs a 2-bit signal MASK_CNT_POST to a FIFO 448 that is one of the FIFOs 362, and that serves as a storage section. The signal MASK_CNT_POST represents the number of words that should be ignored between the end memory address and the nearest subsequent memory boundary of the DRAM 232 during a data transfer. The post-mask generator 447 further formulates and outputs a 1-bit signal MASK_CNT_TOTAL<2>. A more detailed discussion of the post-mask generator 447 is provided later.

The FIFOs 362 include a FIFO 449 that receives the signals UBL and PORT from the command CMD, and that serves as a storage section. The FIFOs 362 receive control signals STORE and READ that simultaneously control all of the FIFOs 443, 448, and 449. The signal STORE instructs each of the FIFOs 443, 448, and 449 to store data being received at its respective input. The signal READ tells the FIFOs 443, 448, and 449 when data has been read out of those FIFOs. Moreover, the FIFOs 362 output an active-high signal FULL FLAG that, when asserted, indicates the FIFOs 362 are full, or in other words contain information for 4 commands. The portion 434 of the arbiter 338 includes a 2-input OR gate 452 that receives the signals MASK_CNT_PRE and MASK_CNT_POST from the respective pre-mask and post-mask generators 442 and 447. The output of the OR gate 452 is the signal MASK_EN for the command count generator 437.

The portion 434 of the arbiter 338 further includes a control section 457. The control section 457 receives the signals CMD PORT PRIORITIES, DRAM PIN_COUNT, DATA PORT CONFIGURATION, and DRAM_BL from the memory cells 239 (FIG. 3). In addition, the control section 457 receives the signals UBL and PORT from the FIFO 449, and the values MASK_CNT_PRE and MASK_CNT_POST from the respective FIFOs 443 and 448. The control section 457 further receives the signals CMD REQ, MEMORY READ EN, and MEMORY WRITE EN from the controller core 319 (FIG. 3). The control section 457 also receives the signals EMPTY FLAG 0-5 from the respective command ports 309-314.

The control section 457 includes the SUBPORT FIFO 383 that was previously discussed in association with FIG. 3. The control section 457 supplies the signal CMD_PORT_SEL to the command selector 318 (FIG. 3). Moreover, the control section 457 supplies the signals CMD STATUS FLAGS 0-5 to the respective command ports 309-314. Further, the control section 457 supplies the signals STORE and READ to the FIFOs 362. In addition, the control section 457 supplies the signal CMD IN to the controller core 319. The control section 457 formulates and outputs an 8-bit signal DF_ACTIVE and a 1-bit signal DF_MASK that are each active-high. The signals DF_ACTIVE and DF_MASK will be described in more detail later.

The portion 434 of the arbiter 338 further includes a 2-to-1 selector 462 that receives the 8-bit signal DF_ACTIVE at one input and an 8-bit logic-low ground signal at its other input. In addition, the selector 462 has a select input that receives the 1-bit signal DF_MASK from the control section 457. The selector 462 outputs an 8-bit signal that is either the 8-bit signal DF_ACTIVE or the binary value 00000000, depending on the state of the signal DF_MASK that is applied to its select input. For example, the selector 462 supplies the 8-bit signal DF_ACTIVE to its output when the signal DF_MASK is low, and supplies the 8-bit binary value 00000000 signal to its output when the signal DF_MASK is high.

The portion 434 of the arbiter 338 also has an 8-bit DF_EN REGISTER 467 that captures the signals from the output of the selector 462. In particular, the DF_EN REGISTER 467 has an 8-bit D input that is coupled to the output of the selector 462, and has a clock input that receives a clock signal CLK. In addition, the DF_EN REGISTER 467 has a Q output that supplies an 8-bit signal DF_EN to the data storage portion 243 (FIG. 3). The 8-bit signal DF_EN includes the signals DF_EN 0R, DF_EN 0W, DF_EN 1R, DF_EN 1W, DF_EN 2, DF_EN 3, DF_EN 4, DF_EN5 (FIG. 3).

Figure 5:
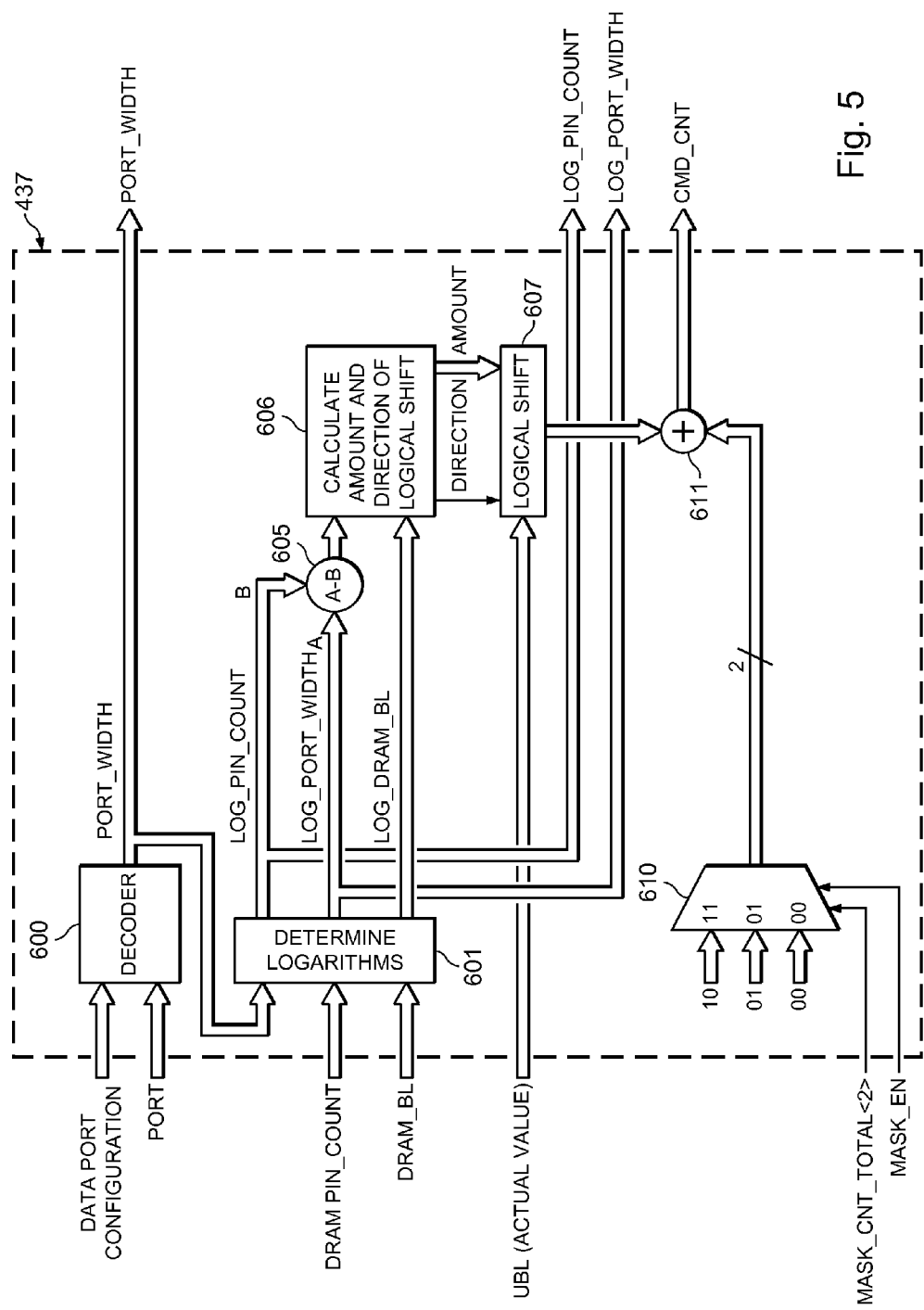
FIG. 5 is a block diagram showing in more detail a command count generator that is part of the arbiter circuitry shown in FIG. 4.

FIG. 5 is a block diagram showing in more detail the command count generator 437 that is part of the portion 434 (FIG. 4) of the arbiter 338 (FIG. 3). The command count generator 437 includes a decoder 600 that receives the DATA PORT CONFIGURATION from the memory cells 239 (FIG. 3), and the port address PORT. The decoder 600 determines the width (32, 64, or 128 bits) of the data port specified by the port address PORT in the current command, and outputs that width value as a signal PORT_WIDTH. The command count generator 437 further includes a block 601 that determines logarithms. The block 601 receives the DRAM PIN_COUNT and the DRAM_BL from the memory cells 239. In addition, the block 601 receives the PORT_WIDTH from the output of the decoder 600. In turn, the block 601 determines the base two logarithms of each of these inputs, and outputs these logarithms as respective signals LOG_PIN_COUNT, LOG_DRAM_BL, and LOG_PORT_WIDTH. The values DRAM PIN_COUNT, DRAM_BL, and PORT_WIDTH are each an integer power of 2, and the corresponding logarithm is thus the integer exponent.

The command count generator 437 includes a subtractor 605 that receives LOG_PORT_WIDTH and LOG_PIN_COUNT, subtracts the latter from the former, and outputs the difference. The command count generator 437 includes a block 606 that calculates the amount and direction of a logical shift. The block 606 receives the output of the subtractor 605 and LOG_DRAM_BL as inputs. The block 606 determines the amount and direction of the logical shift and outputs the respective signals AMOUNT and DIRECTION. In further detail, the block 606 determines the signal DIRECTION by comparing LOG_DRAM_BL with the output of the subtractor 605. If LOG_DRAM_BL is greater than the output of the subtractor 605 then the shift DIRECTION is left. Otherwise the shift DIRECTION is right. Moreover, the block 606 determines the signal AMOUNT by taking the absolute value of the difference between LOG_DRAM_BL and the output of the subtractor 605. For example, if the DIRECTION is left, the AMOUNT of shift is the output of the subtractor 605 less LOG_DRAM_BL. On the other hand, if the DIRECTION is right, the AMOUNT of shift is LOG_DRAM_BL less the output of the subtractor 605.

The command count generator 437 further includes a logical shift block 607 that receives the actual value of the user burst length (UBL) from the current command. The block 607 also receives the signals AMOUNT and DIRECTION as control inputs, and performs a logical shift of the UBL by the number of bits specified by AMOUNT in the direction specified by DIRECTION, and outputs the result. Because the UBL is a binary number, the logical shift of the UBL is carried out in base 2.

The command count generator 437 also includes a 3-to-1 selector 610. The selector 610 receives at its input three 2-bit values "10," "01," and "00." In addition, the selector 610 receives as select inputs the two 1-bit select signals MASK_CNT_TOTAL<2> and MASK_EN. The selector 610 outputs one of the three 2-bit input values, based on the select signals. Table 1 is a truth table implemented by the selector 610.

TABLE 1

| MASK_CNT_TOTAL<2> | MASK_EN | Output of Selector 610 |
| --- | --- | --- |
| 0 | 0 | 00 |
| 0 | 1 | 01 |
| 1 | 0 | Invalid |
| 1 | 1 | 10 |

As shown in Table 1, the output of the selector 610 has three valid states. First, when the signals MASK_CNT_TOTAL<2> and MASK_EN are both low, the output of the selector 610 is a 2-bit signal "00." When the signal MASK_CNT_TOTAL<2> is low and the signal MASK_EN is high, the output of the selector 610 is a 2-bit signal "01." Finally, when the signals MASK_CNT_TOTAL<2> and MASK_EN are both high, the output of the selector 610 is a 2-bit signal "10." There is no valid operational state in which the signal MASK_CNT_TOTAL<2> is high and the signal MASK_EN is low.

The command count generator 437 also includes an adder 611 that receives the output of the logical shift block 607 and the 2-bit output of the selector 610. The adder 611 adds these two signals and outputs the sum as the 9-bit signal CMD_CNT. In effect, the adder uses the output of the selector 610 to adjust the output of the logical shift block 607. This adjustment helps to compensate for the difference or offset (if any) between the starting memory address of a memory read or write operation, and the nearest preceding memory address boundary. As evident from the foregoing discussion, CMD_CNT is determined as a function of several parameters, including the PIN_COUNT, PORT_WIDTH, DRAM_BL, and UBL. The use of logarithms and a logical shift permits multiplications and divisions to be carried out rapidly and efficiently.

Figure 6:
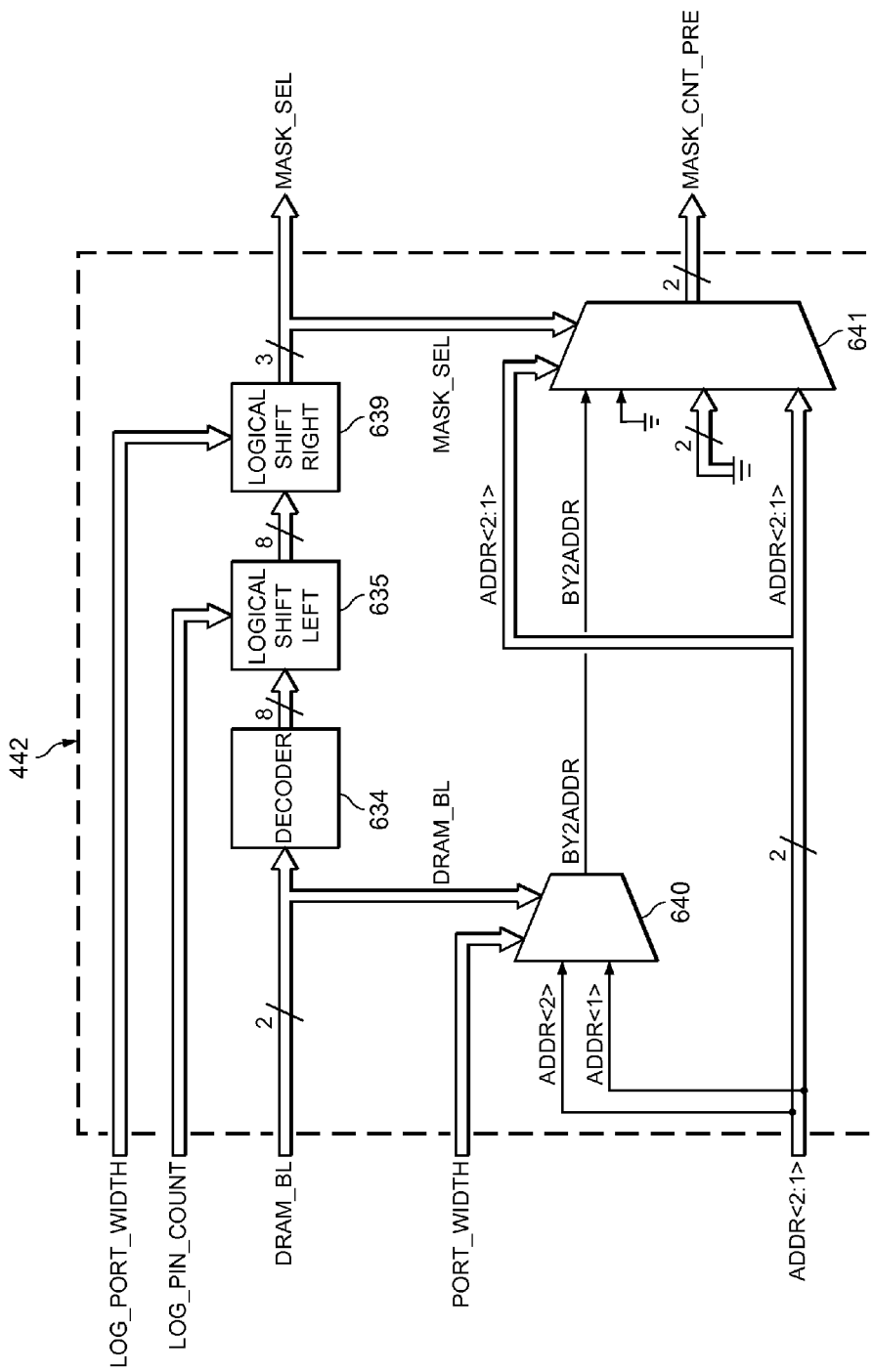
FIG. 6 is a block diagram showing in more detail a pre-mask generator that is part of the arbiter circuitry shown in FIG. 4.

FIG. 6 is a block diagram showing in more detail the pre-mask generator 442 that is a part of the portion 434 (FIG. 4) of the arbiter 338 (FIG. 3). The pre-mask generator 442 includes a decoder 634 that receives the 2-bit DRAM_BL value from the memory cells 239 (FIG. 3). The decoder 634 produces an 8-bit output based on the 2-bit DRAM_BL input. Since the memory burst length DRAM_BL in the embodiment of FIG. 3 is configured to be 4 words, the decoder 634 outputs the value 4 as an 8-bit binary signal 00000100. Alternatively, if the memory burst length DRAM_BL had been configured to be 8 words, the decoder 634 would output the value 8 as an 8-bit binary signal 00001000.

The pre-mask generator 442 also includes a logical shift left block 635 that receives the 8-bit output of the decoder 634 as a data input. In addition, the logical shift left block 635 has a control input that receives the value LOG_PIN_COUNT. The logical shift left block 635 shifts the 8-bit value received at its data input left by the number of bits specified by the value of LOG_PIN_COUNT. In other words, the logical shift left block 635 effectively multiplies the memory burst length by the memory pin count. The output of the logical shift left block 635 is an 8-bit value that represents the number of bits that are accessed by the DRAM 232 (FIG. 3) in a single memory burst.

The pre-mask generator 442 further includes a logical shift right block 639 that receives the 8-bit output of the logical shift left block 635 as a data input. In addition, the logical shift right block 639 has a control input that receives the value LOG_PORT_WIDTH. The logical shift right block 639 shifts the 8-bit value received at its data input right a number of bits specified by the value of LOG_PORT_WIDTH. In other words, the logical shift right block 635 divides the 8-bit input (DRAM_BL•LOG_PIN_COUNT) by the port width. The output of the logical shift right block 639 is a 3-bit signal MASK_SEL, which is the three least significant bits of the shift result, and represents the number of configured data ports that are needed to store the amount of data accessed in a single memory burst.

The pre-mask generator 442 includes a special 2-to-1 selector 640 that has two inputs for receiving the signals ADDR<2> and ADDR<1> that are the third and second least significant bits of the starting memory address. The selector 640 includes select inputs for receiving the signals PORT_WIDTH and DRAM_BL. The output of the selector 640 is a 1-bit signal BY2ADDR that is dependent on the inputs and select signals. Table 2 shows possible outputs of the selector 640 for given input signals ADDR<2>, ADDR<1> and given select signals PORT_WIDTH, DRAM_BL. As shown in Table 2, when the PORT_WIDTH is 32 and the DRAM_BL is 4, the selector 640 outputs the 1-bit signal ADDR<1> as the signal BY2ADDR. In all other instances, the selector 604 outputs the 1-bit signal ADDR<2> as the signal BY2ADDR.

TABLE 2

| PORT_WIDTH | DRAM_BL | BY2ADDR |
| --- | --- | --- |
| 32 | 4 | ADDR<1> |
| All other conditions. | | ADDR<2> |

The pre-mask generator 442 includes another selector 641 that has three 2-bit inputs. The first 2-bit input receives a 1-bit logic-low ground signal and the 1-bit signal BY2ADDR, together represented here as 0, BY2ADDR where BY2ADDR is the least significant bit. The second 2-bit input receives two logic-low ground signals, or in other words always has the binary value 00. The third 2-bit input receives the two memory address bits ADDR<2:1>. The selector 641 also includes two select inputs. The select inputs receive the 2-bit signal ADDR<2:1>, and the 3-bit signal MASK_SEL from the output of the logical shift right block 639. The output of the selector 641 is the pre-masking count signal MASK_CNT_PRE. Table 3 shows the output of the selector 641 for various states of the select input signals ADDR<2:1> and MASK_SEL.

TABLE 3

| ADDR<2:1> | MASK_SEL | MASK_CNT_PRE |
| --- | --- | --- |
| 00 | XXX | 00 |
| XX | 001 | 00 |
| XX | 010 | 0, BY2ADDR |
| XX | 100 | ADDR<2:1> |

As shown in Table 3, when the 2-bit select input ADDR<2:1> is "00," the signal MASK_CNT_PRE at the output of the selector 641 is the 2-bit signal "00," without regard to the signal MASK_SEL at the other select input. In addition, the signal MASK-CNT_PRE at the output is "00" when the signal MASK_SEL at the select input of the selector 641 is "001," without regard to the signal ADDR<2:1> that appears at the other select input of the selector 641. Moreover, the signal MASK_CNT_PRE at the output of the selector 641 is "0, BY2ADDR" when the signal MASK_SEL at the select input is "010," without regard to the signal ADDR<2:1> that appears at the other select input. Also, when the signal MASK_SEL is "100," the signal MASK_CNT_PRE at the output of the selector 641 is ADDR<2:1>, without regard to the signal ADDR<2:1> that appears at the other select input.

Figure 7:
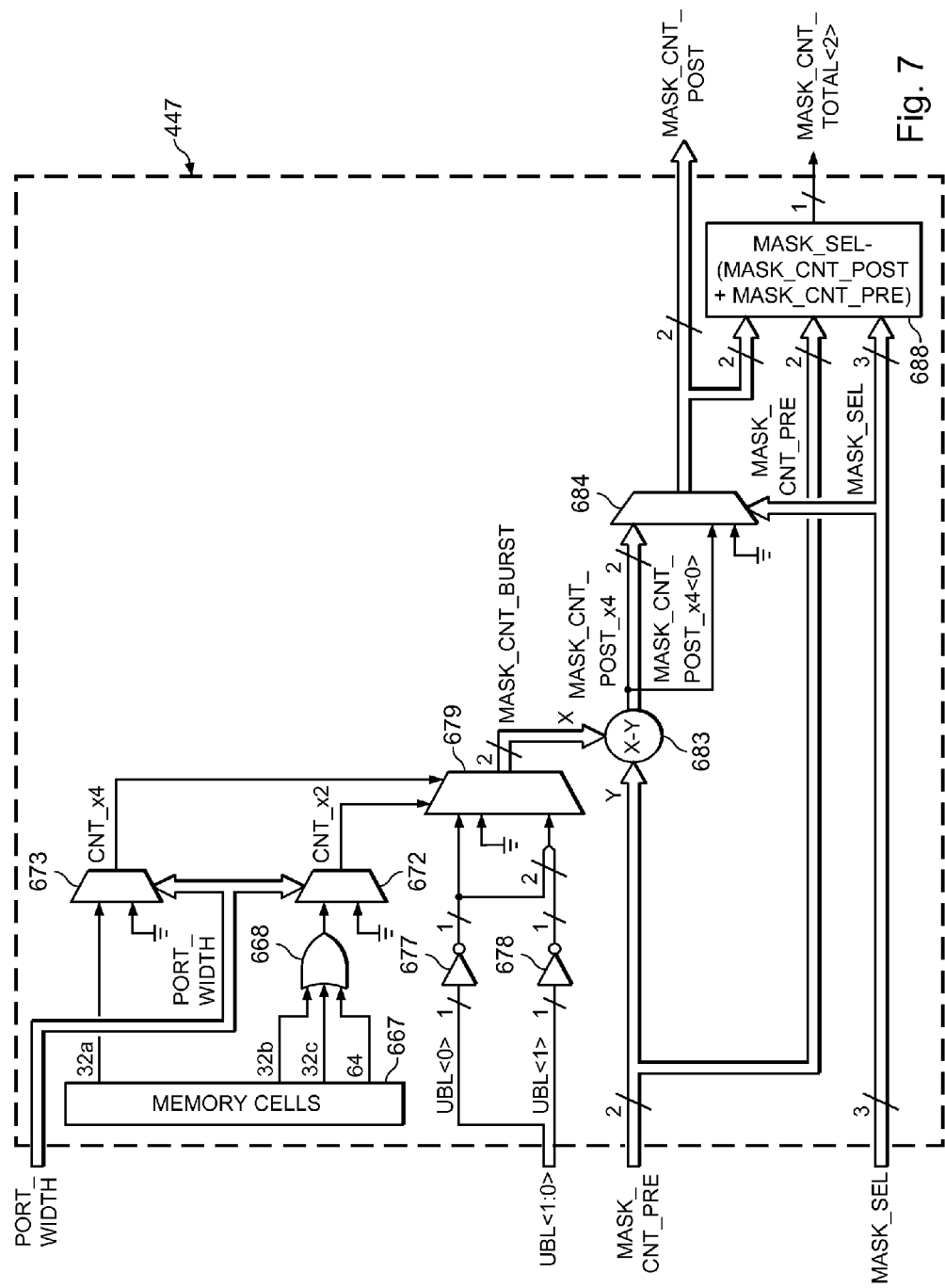
FIG. 7 is a block diagram showing in more detail a post-mask generator that is part of the arbiter circuitry shown in FIG. 4.

FIG. 7 is a block diagram showing in more detail the post-mask generator 447 that is part of the portion 434 (FIG. 4) of the arbiter 338 (FIG. 3). The post-mask generator 447 includes memory cells 667 that output four active-high signals 32a, 32b, 32c, and 64. The state of the signals 32a, 32b, 32c, and 64 are set during user field programming of the FPGA 100 (FIG. 3), and are based on the port widths of the configured data ports (from the DATA PORT CONFIGURATION), the DRAM PIN_COUNT, and the DRAM_BL. Table 4 shows how the states of the signals 32a, 32b, 32c, and 64 are determined at the time of field programming.

TABLE 4

| Port Widths (from DATA PORT CONFIGURATION) | DRAM PIN_COUNT | DRAM_BL | 32a | 32b | 32c | 64 |
| --- | --- | --- | --- | --- | --- | --- |
| 32 | 16 | 8 | 1 | X | X | X |
| 32 | 16 | 4 | X | 1 | X | X |
| 32 | 8 | 8 | X | X | 1 | X |
| 64 | 16 | 8 | X | X | X | 1 |

As shown in Table 4, the signal 32a is set to a permanent logic high if the port width of any configured data port is 32 bits, the DRAM PIN_COUNT is 16, and the DRAM_BL is 8. Otherwise, the signal 32a is a logic low. The signal 32b is set to a permanent logic high if the port width of any configured data port is 32 bits, the DRAM PIN_COUNT is 16, and the DRAM_BL is 4. Otherwise, the signal 32b is a logic low. The signal 32c is set to a permanent logic high if the port width of any configured data port is 32 bits, the DRAM PIN_COUNT is 8, and the DRAM_BL is 8. Otherwise, the signal 32c is a logic low. The signal 64 is set to a permanent logic high if the port width of any configured data port is 64 bits, the DRAM PIN_COUNT is 16, and the DRAM_BL is 8. Otherwise, the signal 64 is a logic low.

The post-mask generator 447 includes a 3-input OR gate 668 that receives the signals 32b, 32c, and 64. In addition, the post-mask generator 447 includes a 2-to-1 selector 672 with data inputs that receive the output of the OR gate 668 and a logic-low ground signal. The selector 672 has a select input that receives PORT_WIDTH from the output of the command count generator 437 (FIG. 4). The output of the selector 672 is a signal CNT_X2.

The post-mask generator 447 also includes a 2-to-1 selector 673. The selector 673 includes an input that receives the signal 32a from the memory cells 667, and another input that is coupled to ground. The selector 673 includes a select input that receives PORT_WDITH from the output of the command count generator 437 (FIG. 4). The output of the selector 672 is a signal CNT_X4. Table 5 is a truth table showing the operation of the selectors 672 and 673.

TABLE 5

| PORT_WIDTH | 32a | 32b | 32c | 64 | CNT_X4 | CNT_X2 |
|---|---|---|---|---|---|---|
| 32 | 1 | X | X | X | 1 | 0 |
| 32 | X | 1 | X | X | 0 | 1 |
| 32 | X | X | 1 | X | 0 | 1 |
| 64 | X | X | X | 1 | 0 | 1 |
| All other conditions. | | | | | 0 | 0 |

As shown in Table 5, when the PORT_WIDTH of the data port specified by the current command is 32 bits and the signal 32a is high, the signal CNT_X4 is high and the signal CNT_X2 is low. When the PORT_WIDTH is 32 bits and either of the signals 32b and 32c is high, the signal CNT_X4 is low and the signal CNT_X2 is high. Similarly the signals CNT_X4 and CNT_X2 are respectively low and high when the PORT_WIDTH is 64 and the signal 64 is high. In all other instances, the signals CNT_X4 and CNT_X2 are each low.

The post-mask generator 447 also includes inverters 677 and 678. The inverter 677 receives a signal UBL<0> that is the least significant bit of the user burst length UBL. The output of the inverter 677 is the inverse of the signal UBL<0>. The inverter 678 receives a signal UBL<1> that is the second least significant bit of the UBL. The output of the inverter 678 is the inverse of the signal UBL<1>. The post-mask generator 447 also has a 2-to-1 selector 679 that receives one 2-bit input that includes a ground signal and the inverse of the signal UBL<0> from the output of the inverter 677, where the inverse of UBL<0> is the least significant bit. In addition, the selector 679 includes another 2-bit input that receives the inverse of the 2-bit signal UBL<1:0> from the outputs of the inverters 677 and 678. The selector 679 includes two select inputs that receive the signals CNT_X2 and CNT_X4 from the selectors 672 and 674. The output of the selector 679 is a 2-bit signal MASK_CNT_BURST. Table 6 is a truth table representing the operation of the selector 679, where an exclamation point "!" designates inversion.

TABLE 6

| CNT_X2 | CNT_X4 | MASK_CNT_BURST |
|---|---|---|
| 0 | 0 | 00 |
| 0 | 1 | !UBL<1:0> |
| 1 | 0 | 0, !UBL<0> |
| 1 | 1 | Invalid |

As shown in Table 6, when the select inputs CNT_X2 and CNT_X4 are both "0," the signal MASK_CNT_BURST at the output of the selector 679 is "00." When the select input CNT_X2 is "0" and the select input CNT_X4 is "1," the signal MASK_CNT_BURST at the output of the selector 679 is the outputs of the inverters 677 and 678, and is thus the inverse of the two least significant bits of the signal UBL (!UBL<1:0>). When the select input CNT_X2 is "1" and the select input CNT_X4 is "0," the signal MASK_CNT_BURST at output of the selector 679 is "0, !UBL<0>". In other words, the 2-bit signal MASK_CNT_BURST has a most significant bit that is "0" and a least significant bit that is the inverse of the least significant bit of the signal UBL. The select signals CNT_X2 and CNT_X4 are never both high.

The post-mask generator 447 includes a subtractor 683 that receives two operands. The subtractor 683 receives the signal MASK_CNT_BURST from the output of the selector 679. The subtractor 683 also receives the signal MASK_CNT_PRE from the pre-mask generator 442 (FIG. 4). The subtractor 683 subtracts the signal MASK_CNT_PRE from the signal MASK_CNT_BURST. The output of the subtractor 683 is a 2-bit signal MASK_CNT_POST_X4.

The post-mask generator 447 includes another 2-to-1 selector 684. The selector 684 includes one data input that receives the 2-bit signal MASK_CNT_PSOT_X4 from the output of the subtractor 683. The other 2-bit input of the selector 684 includes a ground signal and a signal MASK_CNT_POST_X4<0> that is the least significant bit of the signal MASK_CNT_POST_X4, where MASK_CNT_POST_X4<0> is the least significant bit at the selector input. The selector 684 includes a select input that receives the 3-bit signal MASK_SEL from the pre-mask generator 442 (FIG. 4). The output of the selector 684 is a 2-bit signal MASK_CNT_POST that represents the number of memory locations that should be masked (ignored) between the ending memory address of a user request and the nearest subsequent memory boundary of the DRAM 232 during a data transfer. Table 7 is a truth table representing the operation of the selector 684.

TABLE 7

| MASK_SEL | MASK_CNT_POST |
|---|---|
| 010 | 0, MASK_CNT_POST_X4<0> |
| All other | MASK_CNT_POST_X4 |

As shown in Table 7, when the select input signal MASK_SEL is "010," the signal MASK_CNT_POST at the output of the selector 684 is the 2-bit signal 0, MASK_CNT_POST_X4<0>. In all other instances, the signal MASK_CNT_POST at the output of the selector 684 is the 2-bit signal MASK_CNT_POST_X4.

The post-mask generator 447 also includes an arithmetic block 688 that receives the 2-bit signal MASK_CNT_POST from the output of the selector 684. The block 688 also receives the 2-bit signal MASK_CNT_PRE and the 3-bit signal MASK_SEL from the output of the pre-mask generator 442 (FIG. 4). The block 688 adds the signals MASK_CNT_PRE and MASK_CNT_POST, and then subtracts the result of that operation from the signal MASK_SEL to obtain a result, the third least significant bit of which is a signal MASK_CNT_TOTAL<2> that is the output of block 688. The output of the block 688 is coupled to the command count generator 437.

Figure 8:
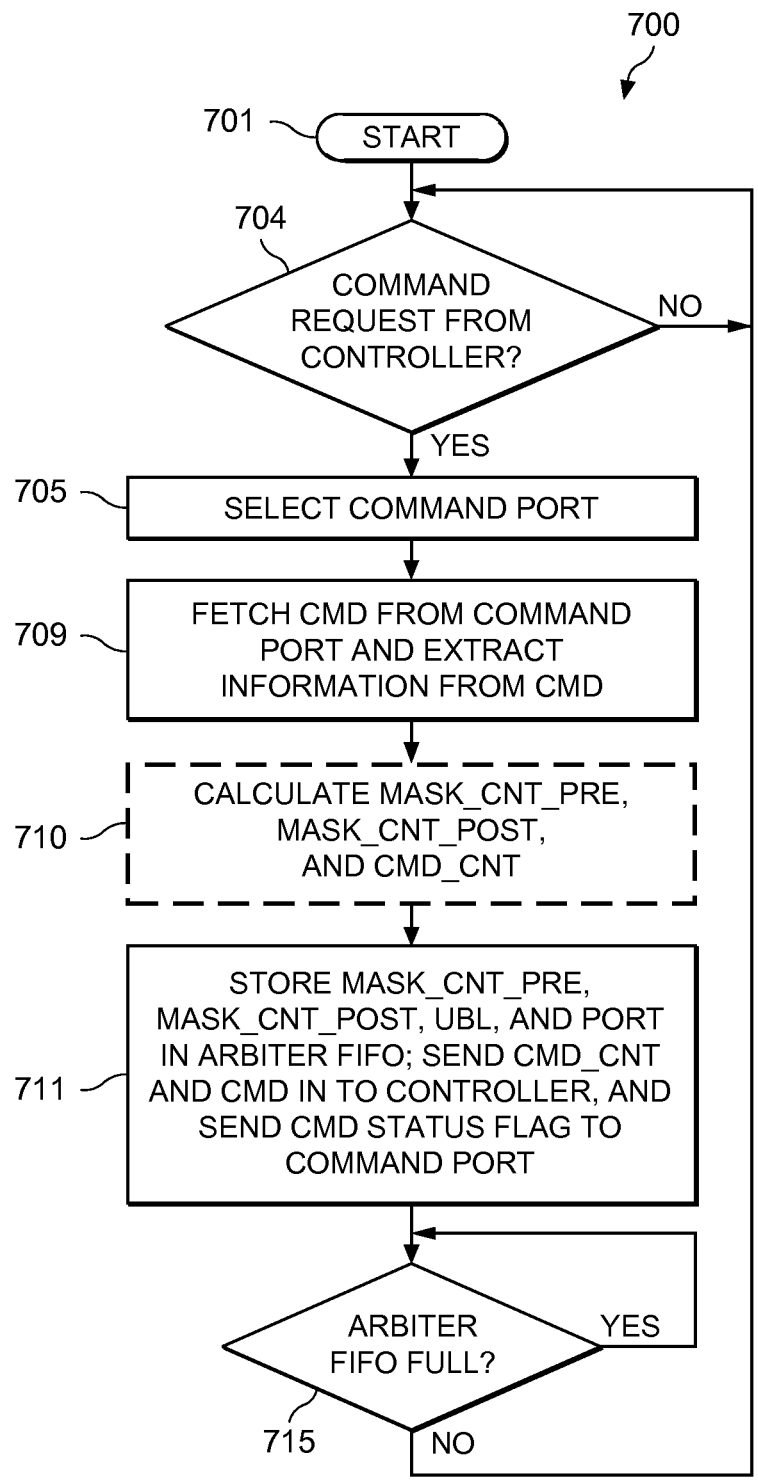
FIG. 8 is a flowchart showing selected aspects of the operation of a control section that is part of the arbiter circuitry shown in FIG. 4.

The control section 457 of the arbiter 338 includes hard-wired circuitry created by first defining the circuitry in the VERILOG® hardware design language (HDL) available commercially from Cadence Design Systems Inc. of San Jose, Calif., and by then compiling the VERILOG® code to obtain the actual hard-wired circuitry. FIG. 8 is a flowchart of a method 700 implemented by this hard-wired circuitry in the control section 457. The flowchart of FIG. 8 is a convenient way of showing how the circuitry in the control section 457 carries out reading into the arbiter 338 of commands from the command storage portion 306 (FIG. 3). Alternatively, the method 700 could be carried out by a high-speed processor that executes code, instead of being carried out by hard-wired circuitry in the control section 457.

The method 700 starts at block 701. The method 700 continues at block 704 where the control section 457 (FIG. 4) monitors the arbiter's input 359 to see if there is a command request CMD REQ from the controller core 319. If there has been no command request, the method 700 stays at block 704 where the control section 457 continues to monitor for a command request. If there has been a command request, then the method 700 continues to block 705. At block 705 the control section 457 selects one of the command ports 309-314 from the command storage portion 306. As previously discussed, the control section 457 goes through the EMPTY FLAG signals for the command ports in a predetermined sequence that is defined by the command priorities stored in the memory cells 239 (FIG. 3), and selects the first command port that is not empty. Then, the method 700 continues to block 709. At block 709 the control section 457 fetches a command from the selected command port, and the arbiter 338 extracts information from that command. For example, the arbiter 338 extracts the user burst length UBL and data port address PORT. Moreover, the arbiter 338 also extracts the third and second least significant bits (ADDR<2:1>) of the memory address for this command.

The method 700 continues at block 710 where the generators 432, 442, and 447 formulate the signals MASK_CNT_PRE, MASK_CNT_POST, and the command count CMD_CNT. As indicated diagrammatically by the dotted line around block 710, these signals are not formulated within the control section 457, but for clarity this activity is shown in the method 700 at block 710 because it occurs at that point in the process and facilitates an understanding of the process.

The method 700 continues at block 711 where the control section 457 stores the signals MASK_CNT_PRE and MASK_CNT_POST in the FIFOs 362, along with the UBL and data port address PORT that were extracted from the command that is being read in. In addition, the arbiter 338 supplies the signal CMD_CNT to the controller core 319 (FIG. 3). Moreover, at block 711, the control section 457 sends the signal CMD IN to the controller core 319 so that the controller core 319 is advised that a command is being read from the command storage portion 306 and is arriving at its input 324. In turn, the controller core 319 receives the command at its input 324, extracts certain information for later use, and stores that information and CMD_CNT in the FIFO 328. The control section 457 further sends a respective CMD STATUS FLAG to the command port from which the command was read, so that the command port knows a command has been read from it.

The method 700 continues at block 715 where the control section 457 checks the active-high signal FULL FLAG from the FIFOs 362 to determine whether the FIFOs 362 are full, or in other words contain information for 7 commands. This process of reading in commands and filling up the FIFOs 328 and 362 in the controller core 319 and arbiter 338, respectively, is a continuous process that pauses only if the FIFOs 328 and 362 are temporarily full, or if there are no commands in the command storage portion 306. If the FIFOs 362 are full, the method 700 remains at block 715 until the FIFOs 362 are no longer full, or in other words until a command in the FIFOs 362 has been extracted and executed. If the FIFOs 362 are not full, the method 700 repeats, starting at block 704 where the control section 457 awaits another command request CMD REQ from the controller core 319 before advancing through the method 700.

Figure 9:
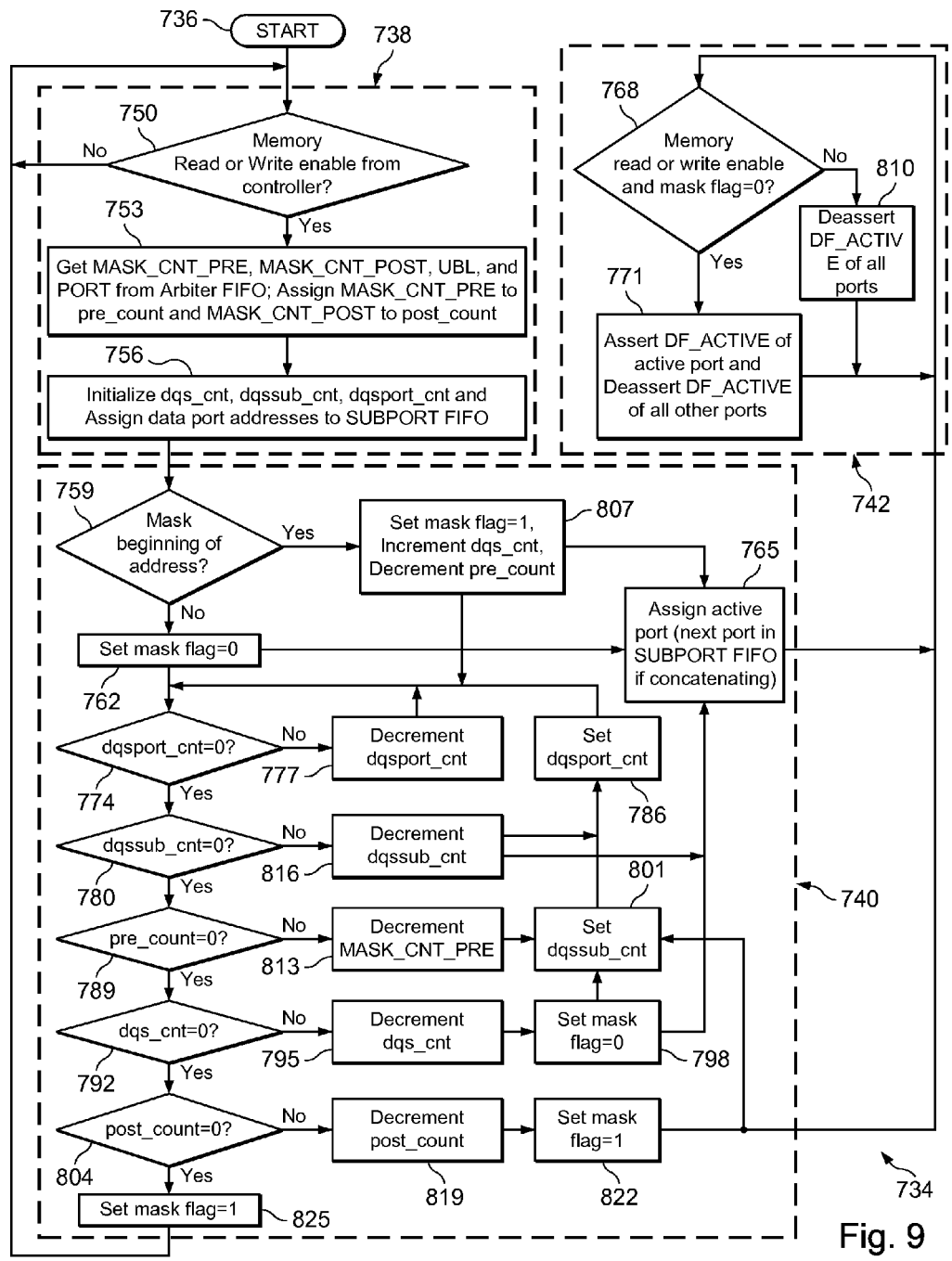
FIG. 9 is flowchart of showing other selected aspects of the operation of the control section in the arbiter circuitry of FIG. 4.

FIG. 9 is flowchart of a further method 734 implemented by the hard-wired circuitry in the control section 457. The flowchart of FIG. 9 is a convenient way of showing how circuitry in the control section 457 generates signals DF_ACTIVE that are supplied to inputs of the selector 462 (FIG. 4), and controls the signal DF_MASK that is supplied to the select input of the selector 462 (FIG. 4). The selector 462 in turn produces the enable signals DF_EN that control the data ports 244-251 (FIG. 3). Alternatively, the method 734 could be carried out by a high-speed processor that executes code, instead of being carried out by hard-wired circuitry in the control section 457.

The method 734 starts at block 736 and includes three different portions 738, 740, and 742 that are now discussed in general and later in more detail. The portion 738 occurs immediately after the method 734 starts at block 736 and in general handles receiving a READ or WRITE request from the controller core 319, then retrieving information that is stored in the arbiter's FIFOs 362, and initializing other values for use in the portion 740. The portion 740 follows immediately after the portion 738 and in general decides which of the data ports 244-251 should be active during a data transfer (this includes accounting for concatenation), and decides the sequence in which those active data ports should be enabled where more than one data port is involved. The portion 740 also provides for pre-masking and post-masking portions of a memory access. In parallel with the portion 740 of the method 734, the portion 742 is used for asserting and deasserting the 8 signals DF_ACTIVE that are supplied to an input of the selector 462 (FIG. 4).

In more detail, refer to the portion 738 of the method 734. For the sake of discussion, assume that two 32-bit data words (from the perspective of the FPGA fabric 238) are to be transferred in either direction between the fabric and the DRAM 232, in a transfer that does not require data port concatenation. In particular, assume this data transfer uses only one of the 32-bit data ports 248-251 in the configuration of FIG. 3. Recall that in the disclosed embodiment the DRAM 232 has a memory burst length (DRAM_BL) of 8 words, and an 8-bit data interface width (DRAM PIN_COUNT). Therefore, for each memory access, the DRAM 232 can access eight 8-bit words, or 64 bits in total. In other words, each memory access involves eight time slots where each time slot could be used for transfer of one 8-bit word. Assume that, in the present example, the memory starting and ending addresses of the data transfer occur at memory boundaries, and therefore pre-masking and post-masking are unnecessary. Moreover, the data converter 241 transfers data to and from the data storage portion 243 in 16-bit words.

Immediately after the start of the method 734 (at block 736), the control section 457 (FIG. 4) waits for a memory read or write enable signal MEMORY READ EN or MEMORY WRITE EN to arrive from the controller core 319 at one of the respective inputs 381 and 382. When a READ or WRITE enable signal is received, it indicates that the oldest command in the FIFOs 362 is to be executed, and the method 734 advances to block 753. In block 753, the control section 457 retrieves the values MASK_CNT_PRE, MASK_CNT_POST, UBL, and PORT from the FIFOs 362, for the oldest command in the FIFOs. Since neither pre-masking nor post-masking is necessary in the specific example under discussion, the values MASK_CNT_PRE and MASK_CNT_POST are both zero. Moreover, since this data transfer is for two 32-bit data words (to or from the fabric 238), the actual value of the user burst length is 2, and the stored value UBL is 1 (one less than the actual value). The control section 457 takes the values of MASK_CNT_PRE and MASK_CNT_POST and stores them in the respective variables pre_count and post_count. The values in pre_count, post_count, UBL, and PORT will be used later in the portion 740 of the method 734.

The method 734 continues to block 756 where the control section 457 initializes variables dqs_cnt, dqssub_cnt, and dqsport_cnt. The variable dqs_cnt relates to the user burst length. In particular, the variable dqs_cnt is initialized to the actual value of the user burst length, less one. In the example under discussion, the actual value of the user burst length is 2 and thus the variable dqs_cnt is initialized to 1. The variable dqssub_cnt is the number of data ports needed to achieve the configured port width, less one. In the present example, the data transfer uses only one of the 32-bit data ports 248-251, and thus the variable dqssub_cnt is initialized to 0. The variable dqsport_cnt is the number of words from the data converter 241, less one, that are needed to fill the 32-bit width of one FIFO location in any of the data ports 244-251. In this example, two 16-bit data converter words are needed to fill the 32-bit width of one FIFO location in whichever one of the data ports 244-251 will be used for the transfer. Therefore, the variable dqsport_cnt is initialized to 1. The control section 457 also loads the SUBPORT FIFO 383 with the data port address that is needed for this data transfer. For a transfer of 32-bit data words using a single data port, the control section 457 loads the SUBPORT FIFO 383 with the address of that one 32-bit data port. (For a transfer of 64-bit data words using two concatenated data ports, the control section 457 would load the SUBPORT FIFO 383 with two data port addresses corresponding to those two data ports. Alternatively, if the data storage portion 243 (FIG. 3) were configured to have only 128-bit storage elements, the control section 457 would load the SUBPORT FIFO 338 with four data port addresses for the four data ports making up the 128-bit storage element).

After initialization and assignment of various values in block 756, the method 734 continues to block 759 at the beginning of the portion 740 of the method 734. At block 759 the control section 457 determines if it is necessary to mask (ignore) any memory access locations at the beginning of the data transfer. The control section 457 makes this determination by looking at pre_count. In this example, the variable pre_count is 0 and thus masking before the data transfer is unnecessary, and the method 734 continues to block 762. In block 762 an internal mask flag is set to 0 to indicate that masking is unnecessary before transferring data. From block 762 the method 734 continues to block 765 where the control section 457 assigns an active port, which involves selecting the only port address in the SUBPORT FIFO 383 in the present example of a transfer of four 32-bit data words. (Alternatively, in the case of a transfer involving a 64-bit data word or a 128-bit data word, the control section 457 would assign the active port to be the first port address in the SUBPORT FIFO 383). The method 734 then continues to block 768 where the control section 457 determines whether it should assert the enable signal that corresponds to the active port by checking if there is a memory READ or WRITE enable signal from the controller core 319, and the state of the mask flag. In the present example, masking is unnecessary (mask flag=0). Therefore, if the controller core 319 is requesting a READ or WRITE data transfer (either MEMORY READ EN or MEMORY WRITE EN is present), then the method 734 moves from block 768 to block 771. In block 771, the control section 457 asserts to logic high one of the signals DF_ACTIVE (FIG. 4) that corresponds to the active data port, and deasserts to logic low all the other signals DF_ACTIVE. The control section 457 maintains this state of the signals DF_ACTIVE while the method 734 loops back to the block 768 to continuously monitor for a change in state of the memory READ or WRITE enable signals or a change in state of the mask flag.

In addition, after the mask flag is set to 0 at the block 762, the method 734 proceeds not only to block 765 but also simultaneously proceeds to block 774. At block 774 the control section 457 determines whether the 32-bit width of a FIFO location in the active port has been filled (for a READ) or emptied (for a WRITE), by checking if dqsport_cnt equals 0. If dqsport_cnt is equal to 0, then the entire 32-bit width of the active port has been filled or emptied. Otherwise, transfer of at least one more 16-bit word is necessary to fill or empty the width of the active data port. In the present example, so far only one 16-bit word has been transferred into (READ) or out of (WRITE) the active data port (during block 774). Therefore, the method 734 needs another 16-bit word to completely fill (READ) or empty (WRITE) the 32-bit width of the FIFO location in the active data port. This is indicated by the variable dqsport_cnt which is presently 1. The method 734 proceeds to block 777 where dqsport_cnt is decremented before returning back to the block 774 to repeat the determination of whether the 32-bit wide active data port has been filled or emptied. In this example, dqsport_cnt is decremented to 0 in block 777, and a second 16-bit word is transferred during block 774 to thereby fill or empty the width of the entire active data port. That is, one 32-bit word has been inserted into or has been emptied out of a FIFO location in the active data port.

When the entire width of a FIFO location in the active port has been filled or emptied (dqsport_cnt equals 0), the method 734 proceeds from block 774 to block 780. At block 780, the control section 457 determines whether the data transfer involves port concatenation, or in other words whether additional ports are involved in the data transfer, by checking if dqssub_cnt equals 0. If dqssub_cnt is equal to 0 then no additional ports are necessary for the data transfer. In this example, dqssub_cnt equals 0 since only one of the 32-bit data ports 248-251 is needed, and thus concatenation is unnecessary. Alternatively, if the transfer involved concatenated ports, dqssub_cnt would be greater than 0 to indicate that at least one other data port is involved in the data transfer. Pertinent portions of the method 734 that relate to concatenation of data ports will be discussed in detail later.

From block 780, the method 734 proceeds to block 789 where the control section 457 determines whether additional pre-masking is necessary by checking to see if pre_count is equal to 0. Since the example under discussion assumes that pre-masking is unnecessary (pre_count is 0), the method proceeds to block 792 where the control section 457 determines whether the entire user burst length of data has been transferred into (READ) or out of (WRITE) the data storage portion 243, by checking to see if dqs_cnt is equal to 0. When dqs_cnt is greater than 0, there is still additional data to be transferred into or out of the data storage portion 243. In this example, dqs_cnt is 1 at this point and there is still one additional 32-bit data word to be transferred into (READ) or out of (WRITE) the data storage portion 243. Thus, the method 734 continues to block 795 where the control section 457 decrements dqs_cnt (from 1 to 0), and on to block 798 where the mask flag is set to zero because masking is unnecessary. From block 798 the method 734 moves to block 765 where the active port remains the same since concatenation is not involved and there is thus only one data port address in the SUBPORT FIFO 383. The method 734 then proceeds to blocks 768 and 771 so that the portion 742 can continue to assert a logic high on the corresponding one of the signals DF_ACTIVE for the active port and set to logic low all the other DF_ACTIVE signals. From block 798, the method 734 also continues in parallel to the blocks 801 and 786 for re-initializing dqssub_cnt and dqsport_cnt before proceeding to the block 774. In the example under discussion, dqssub_cnt is re-initialized to 0 in block 801 and dqsport_cnt is re-initialized to 1 in block 786. Starting from block 774, the method 734 repeats the process described above of filling up or emptying the entire width of a FIFO location in the active data port, or in other words transferring two successive 16-bit words into or out of the active data port, and eventually returns to block 792. This time at block 792 the variable dqs_cnt is 0 and the control section 457 determines that both 32-bit data words (four 16-bit DDR data converter words or eight 8-bit memory words) have been transferred into (READ) or out of (WRITE) the FIFO in the active data port in the data storage portion 243.

In this example, the method 734 then proceeds to block 804 where the control section 457 determines whether post-masking is necessary by checking to see if post_count is equal to 0. When post_count is equal to 0 (as is the case for the example under discussion), post-masking is unnecessary and the method 734 proceeds to block 825 where the mask flag is set to 1. The mask flag is set to 1 to make sure that, at blocks 768 and 810, the control section 457 sets to logic low all of the signals DF_ACTIVE. This ensures that all of the data ports 244-251 are disabled following a data transfer, in order to prevent undesirable transfers of data into or out of those data ports.

From block 825 the method 734 then loops back to block 750 where the control section 457 waits for another READ or WRITE enable signal from the controller core 319.

The memory read or write enable signal MEMORY READ EN or MEMORY WRITE EN provided by the controller core 319 during a memory access goes to logic low at the end of the memory access, which occurs approximately simultaneously with the determination in block 804 that post-masking (or further post-masking) is unnecessary. As a result, in parallel with the post-masking determination at block 804, the method 734 advances from block 768 to block 810 where the control section 457 sets to logic low all the signals DF_ACTIVE, including the signal DF_ACTIVE that corresponds to the active 32-bit data port. This happens since the entire user burst length has been transferred into (READ) or out of (WRITE) the active data port and any post-masking required has been completed.

Now an explanation of the method 734 is provided for another exemplary transfer of a single 32-bit data word, where concatenation is not involved and post-masking is unnecessary, but for which pre-masking is necessary. Assume that the memory ending address of the data transfer occurs at a memory boundary and therefore, post-masking is unnecessary. However, further assume that the memory starting address is not aligned with a memory boundary. As discussed earlier, the DRAM 232 in FIG. 3 stores 8-bit words, and has a burst length of 8 words. Assume that a single 32-bit data word to be transferred to or from the fabric 238 corresponds to the last four 8-bit words in the 8-word burst. In the example under discussion, pre-masking is needed for the first four 8-bit memory words in the 8-word burst. From the perspective of the fabric 238 the four 8-bit memory words to be masked correspond to one 32-bit data word that is being masked because it is not being transferred to or from the fabric 238. Accordingly, at block 753, the pre_count will be initialized to 1.

The method 734 starts at block 736 and proceeds to block 759 as discussed above. For the example under discussion, the variables pre_count and post_count are respectively initialized to 1 and 0, dqs_cnt is initialized to 0 (one less than the actual value of the user burst length), dqssub_cnt is initialized to 0, and dqsport_cnt is initialized to 1. Recall that at block 759 the control section 457 determines if it is necessary to mask (ignore) any memory access locations at the beginning of a data transfer. The control section 457 makes this determination by looking at pre_count. When pre_count is greater than zero, masking before the data transfer is necessary and the method 734 continues to block 807. In the present example, the variable pre_count is 1 and the method 734 advances to block 807. In block 807 the mask flag is set to 1, the variable dqs_cnt is incremented, and the variable pre_count is decremented. The mask flag is set to 1, dqs_cnt is incremented from 0 to 1, and pre_count is decremented from 1 to 0. Then the method 734 continues to block 765 where the control section 457 assigns the active port in the manner described above. In the present example, the control section 457 selects the only data port being used to be the active port.

After assignment of the active port, the method proceeds to block 768 and further on to block 810 where the control section 457 sets to logic low all the signals DF_ACTIVE, including the signal DF_ACTIVE that corresponds to the active 32-bit data port since pre-masking is necessary. The control section 457 maintains the state of the signals DF_ACTIVE while the method 734 loops back to the block 768 to continuously monitor for a change in state of the memory READ or WRITE enable or a change in state of the mask flag. In addition, from block 807, the method 734 continues to block 774 where no 16-bit data converter word (or pair of 8-bit memory words) is transferred into or out of the active data port, because it is disabled. In the example under discussion, masking of another 16-bit data converter word (or pair of 8-bit memory words) is necessary. At block 774 the variable dqsport_cnt is 1 and thus the method 734 proceeds to block 777 where the variable dqsport_cnt is decremented from 1 to 0. The method then returns to block 774. At block 774, no 16-bit data converter word (or pair of 8-bit memory words) is transferred into or out of the active data port, because it is still disabled. But the variable dqsport_cnt is 0 and so the method 734 proceeds to block 780. At block 780 the control section 457 evaluates whether concatenation is involved as previously discussed. In the example under discussion, it is not (dqssub_cnt=0). Eventually the method moves to block 789 where the control section 457 determines whether additional pre-masking is necessary. In this example, pre_count is equal to 0 and thus further pre-masking is unnecessary.

Now that pre-masking is complete (pre_count=0), the method drops through block 789 and moves to block 792. At block 792 the control section 457 determines whether the entire user burst length of data has been transferred into (READ) or out of (WRITE) the single 32-bit data port by checking to see if dqs_cnt is equal to 0. When dqs_cnt is greater than 0, there is still data to be transferred into or out of that 32-bit data port. In the present example, dqs_cnt is 1 because it was incremented in block 807 after the control section 457 determined that pre-masking was necessary. Therefore, the method 734 continues to block 795 where the control section 457 decrements dqs_cnt (to 0), and on to block 798 where the mask flag is set to 0 because masking is no longer necessary. From block 798 the method 734 moves to block 765 where the active port stays the same since only one of the 32-bit data ports 248-251 is involved in the 32-bit data transfer (concatenation is not involved). The method 734 then proceeds to blocks 768 and 771 so that the portion 742 can assert a logic high to the corresponding one of the signals DF_ACTIVE for that 32-bit data port and provide a logic low to all of the other data ports. From block 798, the method 734 proceeds not only to block 765 but also to the blocks 801 and 786 for re-initializing dqssub_cnt and dqsport_cnt to 0 and 1 before proceeding to the block 774 where the method 734 then begins the process of filling up or emptying the entire width of a FIFO location in the 32-bit active data port. In particular, two 16-bit data converter words (or two pairs of 8-bit memory words) are successively transferred into or out of the active data port. After this occurs, the method 734 eventually drops through blocks 780 and 789 and returns to block 792. Now, the entire user burst length has been filled into or emptied from the 32-bit active data port. Therefore, dqs_cnt is 0 and the method 734 drops through block 792 to block 804 where the control section 457 determines that post-masking is unnecessary.

The memory read or write enable signal MEMORY READ EN or MEMORY WRITE EN that is being provided by the controller core 319 goes to logic low at the end of the memory access, which occurs approximately simultaneously with the determination in block 804 that post-masking (or further post-masking) is unnecessary. As a result, in parallel with the post-masking determination at block 804, the method 734 advances from block 768 to block 810 where the control section 457 sets to logic low all the signals DF_ACTIVE, including the signal DF_ACTIVE that corresponds to the active 32-bit data port. This happens since the entire user burst length has been transferred into (READ) or out of (WRITE) the active data port and post-masking is unnecessary. Moreover, since post-masking is unnecessary the method 734 advances from block 804 to block 825 where the mask flag is set to 1 before the method 734 returns to block 750 where the control section 457 waits for another READ or WRITE enable signal from the controller core 319.

Now an explanation of the method 734 is provided for a transfer of one 64-bit data word (from the perspective of the fabric 238) through a 64-bit data storage portion defined by concatenation of two of the 32-bit data ports 248-251 in the configuration of FIG. 3. In this example, the addresses of the two 32-bit concatenated data ports will be loaded into the SUBPORT FIFO 383 in block 756. Recall that in the configuration of FIG. 3, the DRAM 232 accesses data in blocks of eight 8-bit words (64 bits). Assume that the memory starting and ending addresses of the data transfer align with memory address boundaries. In that case, neither pre-masking nor post masking is necessary.

The method 734 starts at block 736 and proceeds through the blocks 750, 753, and 756 in the portion 738 as previously described. After block 756 the variables pre_count and post_count are each 0, dqs_cnt is 0 (one less than the actual value of the user burst length), dqssub_cnt is 1, and dqsport_cnt is 1. At block 762 the internal mask flag is set to 0 to indicate that masking is unnecessary before transferring data. From block 762 the method 734 continues to block 765 where the control section 457 assigns an active port. In the example under discussion, there are two port addresses in the SUBPORT FIFO 383 and the control section 457 assigns the active port to be the data port having the first port address in the SUBPORT FIFO 383. Thereafter, the method 734 continues to block 768 where the control section 457 determines whether it should assert the enable signal that corresponds to the active port by checking if there is a memory READ or WRITE enable from the controller core 319, and the state of the mask flag. Here, masking is unnecessary (mask flag=0).

Therefore, if the controller core 319 is requesting a READ or WRITE data transfer (either MEMORY READ EN or MEMORY WRITE EN is present), then the method 734 moves from block 768 to block 771. In block 771, the control section 457 asserts to logic high one of the signals DF_ACTIVE that corresponds to the active data port and sets to logic low all the other signals DF_ACTIVE. The control section 457 maintains the state of the signals DF_ACTIVE while the method 734 loops back to the block 768 to continuously monitor for a change in state of MEMORY READ EN or MEMORY WRITE EN, or a change in state of the mask flag.

In addition, after the mask flag is set to 0 at the block 762, the method 734 proceeds not only to block 765 but also simultaneously proceeds in parallel to block 774. During block 774, one 16-bit data converter word (or a pair of 8-bit memory words) is transferred into or out of the active data port. At block 774 the control section 457 determines whether the 32-bit width of a FIFO location in the active port has been filled (for a READ) or emptied (for a WRITE), by checking if dqsport_cnt equals 0. In the example under discussion, so far only one 16-bit data converter word (or one pair of 8-bit memory words) has been transferred into (READ) or out of (WRITE) the active data port. Therefore, the method 734 needs to transfer another 16-bit data converter word (or pair of 8-bit memory words) to completely fill (READ) or empty (WRITE) the 32-bit wide FIFO location in the active data port. This is indicated by the variable dqsport_cnt which is presently 1. The method 734 proceeds to block 777 where dqsport_cnt is decremented (to 0) before returning back to block 774 to again transfer a 16-bit DDR data converter word (or pair of 8-bit memory words) and determine whether the FIFO location in the 32-bit wide active data port has been filled or emptied. In this case, two 16-bit data converter words (or two pairs of 8-bit memory words) have been transferred to fill or empty a width of the entire active data port.

When the entire width of the FIFO location in the active port has been filled or emptied (dqsport_cnt equals 0), the method 734 proceeds from block 774 to block 780. At block 780, the control section 457 determines whether additional ports are involved in the data transfer by checking if dqssub_cnt equals 0. In the example under discussion, since two of the 32-bit data ports 248-251 are concatenated, dqssub_cnt was initialized to 1 at block 756. Therefore, in this case, the method proceeds from block 780 to block 816 where dqssub_cnt is decremented to 0, and then to block 765 where the active port is re-assigned by the control section 457 to be the data port identified by the second data port address in the SUBPORT FIFO 383.

The method 734 then proceeds to blocks 768 and 771 so that the portion 742 can assert a logic high on one of the signals DF_ACTIVE that corresponds to the second data port (now the active port) and provide a logic low to all of the other ports (including the first data port in which a FIFO location has already been filled or emptied). The method 734 also continues in parallel from block 816 to block 786 where dqsport_cnt is re-initialized to 1, before moving back to block 774 and continuing the method as described above to fill (READ) or empty (WRITE) the entire 32-bit width of a FIFO location in the second data port. When the method 734 arrives at block 780 for the second time, dqssub_cnt is 0 and the 32-bit width of a respective FIFO location in each of the two concatenated 32-bit data ports has been filled (READ) or emptied (WRITE). Accordingly, the method 734 drops through block 789 and arrives at block 792 where the method 734 looks at the value dqs_cnt to determine whether additional 64-bit data words need to be filled into (READ) or emptied out of (WRITE) the two concatenated data ports. In this case, dqs_cnt is 0 and therefore no additional 64-bit data words are to be filled into (READ) or emptied out of (WRITE) the two concatenated data ports. Accordingly, the method 734 drops through block 792 to block 804 where the control section 457 determines that post-masking is unnecessary since post_count is 0.

The MEMORY READ EN or MEMORY WRITE EN signal that is being provided by the controller core 319 goes to logic low at the end of the memory access, which occurs approximately simultaneously with the determination in block 804 that post-masking is unnecessary. As a result, in parallel with the post-masking determination at block 804, the method 734 advances from block 768 to block 810 where the control section 457 sets to logic low all the signals DF_ACTIVE, including the signal DF_ACTIVE that corresponds to the currently-active 32-bit data port. This happens since the entire user burst length has been transferred into (READ) or out of (WRITE) the concatenated data ports and post-masking is unnecessary. Moreover, since post-masking is unnecessary, the method 734 advances to block 825 where the mask flag is set to 1 before the method 734 returns to block 750, where the control section 457 waits for another MEMORY READ EN or MEMORY WRITE EN signal from the controller core 319.

Now an explanation of the method 734 is provided for yet another example of two 32-bit data words being transferred (from the perspective of the fabric 238), where concatenation is not involved and pre-masking is unnecessary, but for which post-masking is necessary. For example, assume that the memory starting address of the data transfer occurs at a memory boundary, and therefore pre-masking is unnecessary. However, further assume that the memory ending address is not aligned with a memory boundary. As discussed earlier, the DRAM 232 in FIG. 3 stores 8-bit words, and has a burst length of 8 words. Assume that the single 32-bit data word to be transferred to or from the fabric 238 corresponds to the first four 8-bit words in the 8-word burst. In the example under discussion, post-masking is needed for the last four 8-bit memory words in the 8-word burst. From the perspective of the fabric 238 the four 8-bit memory words to be masked correspond to one 32-bit word that is not being masked because it is not being transferred to or from the fabric, or in other words a post-masking count of 1. The method 736 starts at block 736 and proceeds to block 759 as discussed above. For the example under discussion, the variables pre_count and post_count are respectively initialized to 0 and 1, dqs_cnt is initialized to 0 (one less than the actual user burst length of 1), dqssub_cnt is initialized to 0, and dqsport_cnt is initialized to 1.

At block 759 the method 734 determines that pre-masking is unnecessary and thus the method 734 continues to block 762 to set the internal mask flag to 0, and then proceeds through the pertinent blocks as previously discussed to fill or empty a width of a FIFO location in the active 32-bit active data port. After this is completed just once, the method 734 arrives at block 780 where the control section determines that concatenation is not involved (dqssub_cnt is 0) and thus the method 734 continues to block 789. The method further continues to block 792 since pre-masking is unnecessary (pre_count is 0). In the example under discussion, when the method 734 reaches block 792 for the first time, the entire user burst length (one 32-bit data word) has been transferred into (READ) or out of (WRITE) the active data port in the form of two successive 16-bit data converter words (or two successive pairs of 8-bit memory words). Accordingly, the method 734 advances to block 804 where the control section 457 determines whether post-masking is necessary by checking to see if post_count is equal to 0. In the example under discussion, post_count is equal to one at that point and thus the method 734 advances to block 819. In block 819, post_count is decremented. Thus, in the present example, post_count is decremented from 1 to 0. Then the method proceeds to block 822 where the control section 457 sets the mask flag to 1.

The method 734 proceeds from block 822 to blocks 768 and 810 so that the portion 742 can provide a logic low on each of the signals DF_ACTIVE, including the signal DF_ACTIVE that corresponds to the active port, since post-masking is necessary. From block 822 the method 734 also continues in parallel to blocks 801 and 786 where dqssub_cnt and dqsport_cnt are respectively re-initialized to 0 and 1, before moving back again to block 774 where the method 734 progresses in a manner as described above and carries out the post masking for one 32-bit data word from the perspective of the fabric 238 or two successive 16-bit data converter words (or two successive pairs of 8-bit memory words). This time when the method 734 reaches the block 804 the variable post_count is 0 and therefore the control section 457 determines that further post masking is unnecessary.

The memory read or write enable signal that is being provided by the controller core 319 goes to logic low at the end of the memory access, which occurs simultaneously with the determination in block 804 that post-masking (or further post-masking) is unnecessary. As a result, in parallel with the post-masking determination at block 804, the method 734 advances from block 768 to block 810 where the control section 457 sets to logic low all the signals DF_ACTIVE, including the signal DF_ACTIVE that corresponds to the active 32-bit data port. This happens since the entire user burst length has been transferred into (READ) or out of (WRITE) the active data port and additional post-masking is unnecessary. Moreover, since additional post-masking is unnecessary, the method 734 advances to block 825 where the mask flag is set to 1 before the method 734 returns to block 750 where the control section 457 waits for another READ or WRITE enable signal from the controller core 319.

Although a selected embodiment has been illustrated and described in detail, it should be understood that substitutions and alterations are possible without departing from the spirit and scope of the present invention, as defined by the claims that follow.

What is claimed is:

1. A method of operating a circuit that includes a memory interface, comprising:
   operating the memory interface using memory access cycles that each transfer a quantity of data D across the memory interface;
   receiving a request to transfer a quantity of data Q across the memory interface; and
   calculating a value M as a function of a plurality of parameters, M being a minimum number of the memory access cycles needed to carry out the transfer of the quantity of data Q across the memory interface, wherein the calculating includes determining a logarithm of one of the parameters, and then determining the value M as a function of the logarithm.

2. A method according to claim 1,
   wherein the plurality of parameters include a first parameter and a second parameter;
   wherein the first parameter is a number of successive time slots in each memory access cycle and the second parameter is a number of data words contained in the quantity of data Q;

wherein the determining the logarithm is carried out on the first parameter; and wherein the determining the value M includes determining a value N by logically shifting the second parameter as a function of the logarithm of the first parameter.

3. A method according to claim 2, wherein the logarithm of the first parameter is determined in base 2; and wherein the logically shifting the second parameter is carried out in base 2.

4. A method according to claim 2, wherein the calculating includes deriving a shift direction as a function of the logarithm of the first parameter, and calculating a shift amount as a function of the logarithm of the first parameter; and wherein the shifting the second parameter is carried out so that the second parameter is shifted in the shift direction by the shift amount.

5. A method according to claim 2, wherein each of the memory access cycles begins and ends on respective memory address boundaries;

wherein the transfer of the quantity of data Q begins at a starting memory address; and wherein the determining the value M includes adding the value N and an adjustment value of M, the adjustment value of M being a function of the quantity of data Q and a difference between the starting memory address and a nearest memory address boundary that precedes the starting memory address.

6. A method according to claim 2, wherein the plurality of parameters include a third parameter and a fourth parameter;

wherein the calculating includes determining the logarithm of each of the third and fourth parameters; and wherein the logically shifting the second parameter is carried out as a function of the logarithms of the first, third, and fourth parameters.

7. A method according to claim 6, wherein each of the time slots transfers B1 bits of data across the memory interface;

wherein the third parameter is B1; and wherein the fourth parameter is the number of bits B2 of data in each of the data words in the quantity of data Q.

8. A method according to claim 7, wherein the logically shifting the second parameter includes:

deriving a shift direction in which the second parameter is shifted, the shift direction being derived as a function of the logarithms of the first, third, and fourth parameters; and calculating a shift amount by which the second parameter is shifted, the shifting amount being calculated as a function of the logarithms of the first, third, and fourth parameters.

9. A method according to claim 8, wherein the deriving the shift direction includes:

calculating a difference between the logarithms of the third and fourth parameters; and assigning a left direction to the shift direction if the difference is greater than or equal to the logarithm of the first parameter; and assigning a right direction to the shift direction if the difference is less than the logarithm of the first parameter.

10. A method according to claim 8, wherein the calculating the shift amount includes:

calculating a first difference between the logarithms of the third and fourth parameters; and assigning as the shift amount an absolute value of a second difference between the first difference and the logarithm of the first parameter.

11. An apparatus comprising: a circuit that includes a memory interface that operates using memory access cycles that each transfer a quantity of data D across the memory interface, wherein in response to receipt of a request to transfer a quantity of data Q across the memory interface, the circuit performs a calculation to determine a value M as a function of a plurality of parameters, M being a minimum number of the memory access cycles needed to carry out the transfer of the quantity of data Q across the memory interface, wherein the calculation includes determining a logarithm of one of the parameters, and then determining the value M as a function of the logarithm.

12. An apparatus according to claim 11, wherein the plurality of parameters include a first parameter and a second parameter;

wherein the first parameter is a number of successive time slots in each memory access cycle and the second parameter is a number of data words contained in the quantity of data Q;

wherein the circuit carries out the determining the logarithm on the first parameter; and wherein the circuit carries out the calculation to determine the value M in a manner that includes determining a value N by logically shifting the second parameter as a function of the logarithm of the first parameter.

13. An apparatus according to claim 12, wherein the circuit carries out the determining the logarithm of the first parameter in base 2; and wherein the circuit carries out the logically shifting the second parameter in base 2.

14. An apparatus according to claim 12, wherein the circuit carries out the calculation in a manner that includes:

deriving a shift direction as a function of the logarithm of the first parameter; and calculating a shift amount as a function of the logarithm of the first parameter; and wherein the circuit carries out the logically shifting the second parameter in a manner so that the second parameter is shifted in the shift direction by the shift amount.

15. An apparatus according to claim 12, wherein each of the memory access cycles begins and ends on respective memory address boundaries;

wherein the transfer of the quantity of data Q begins at a starting memory address; and wherein the circuit carries out the calculation in a manner that includes adding the value N and an adjustment value, the adjustment value being a function of the quantity of data Q and a difference between the starting memory address and a nearest memory address boundary that precedes the starting memory address.

16. An apparatus according to claim 12, wherein the plurality of parameters include a third parameter and a fourth parameter;

wherein the circuit carries out the calculation in a manner that includes determining the logarithm of each of the third and fourth parameters; and wherein the circuit carries out the logically shifting the second parameter as a function of the logarithms of the first, third, and fourth parameters.

17. An apparatus according to claim 16,
wherein each of the time slots transfers B1 bits of data across the memory interface;
wherein the third parameter is B1; and
wherein the fourth parameter is the number of bits B2 of data in each of the data words in the quantity of data Q.

18. An apparatus according to claim 17, wherein the circuit carries out the logically shifting the second parameter in a manner that includes:
deriving a shift direction in which the second parameter is shifted, the shift direction being derived as a function of the logarithms of the first, third, and fourth parameters; and
calculating a shift amount by which the second parameter is shifted, the shifting amount being calculated as a function of the logarithms of the first, third, and fourth parameters.

19. An apparatus according to claim 18, wherein the circuit carries out the deriving the shift direction in a manner that includes:
calculating a difference between the logarithms of the third and fourth parameters; and
assigning a left direction to the shift direction if the difference is greater than or equal to the logarithm of the first parameter; and
assigning a right direction to the shift direction if the difference is less than the logarithm of the first parameter.

20. An apparatus according to claim 18, wherein the circuit carries out the calculating the shift amount in a manner that includes:
calculating a first difference between the logarithms of the third and fourth parameters; and
assigning as the shift amount an absolute value of a second difference between the first difference and the logarithm of the first parameter.

* * * * *